(12) United States Patent
Pinarello et al.

(10) Patent No.: US 8,912,851 B2
(45) Date of Patent: Dec. 16, 2014

(54) APPARATUS AND METHOD FOR PROVIDING AMPLIFIER LINEARITY INFORMATION

(75) Inventors: Sandro Pinarello, Munich (DE); Andrea Camuffo, Munich (DE); Chi-Tao Goe, Neubiberg (DE); Nick Shute, Munich (DE); Jan-Erik Mueller, Ottobrunn (DE); Bernhard Sogl, Unterhaching (DE)

(73) Assignee: Intel Mobile Communications GmbH, Neubiberg (DE)

( * ) Notice: Subject to any disclaimer, the term of this patent is extended or adjusted under 35 U.S.C. 154(b) by 65 days.

(21) Appl. No.: 12/981,735

(22) Filed: Dec. 30, 2010

(65) Prior Publication Data

US 2012/0169424 A1     Jul. 5, 2012

(51) Int. Cl.
    *H03G 3/10*        (2006.01)
    *H03F 3/24*        (2006.01)
    *H03F 1/32*        (2006.01)
    *H03F 3/195*       (2006.01)
    *H03G 3/30*        (2006.01)
    *H03F 1/02*        (2006.01)
    *H03F 1/30*        (2006.01)

(52) U.S. Cl.
    CPC .............. *H03G 3/3042* (2013.01); *H03F 3/24* (2013.01); *H03F 1/3247* (2013.01); *H03F 3/195* (2013.01); *H03F 1/0272* (2013.01); *H03F 1/30* (2013.01)
    USPC .......................................... 330/285; 330/296

(58) Field of Classification Search
    USPC .................................................. 330/285, 296
    See application file for complete search history.

(56) References Cited

U.S. PATENT DOCUMENTS

| | | | |
|---|---|---|---|
| 6,721,549 B2 * | 4/2004 | Lee et al. | 455/234.1 |
| 6,735,424 B1 | 5/2004 | Larson et al. | |
| 6,753,735 B2 * | 6/2004 | Arai et al. | 330/297 |
| 7,109,897 B1 * | 9/2006 | Levesque | 341/67 |
| 7,567,126 B2 * | 7/2009 | Arai | 330/285 |
| 7,808,312 B2 * | 10/2010 | Ichitsubo et al. | 330/129 |
| 8,081,777 B2 * | 12/2011 | North | 381/109 |
| 2006/0232339 A1 * | 10/2006 | DeMonte | 330/285 |
| 2010/0007414 A1 | 1/2010 | Searie et al. | |

OTHER PUBLICATIONS

Chinese Office Action dated Aug. 4, 2014 in connection with Chinese Patent Application No. 201110463298.6.

\* cited by examiner

*Primary Examiner* — Henry Choe
(74) *Attorney, Agent, or Firm* — Eschweiler & Associates, LLC

(57) ABSTRACT

An apparatus for providing a linearity information associated with an amplifier includes an operating state determinator and an evaluator. The operating state determinator is configured to obtain information describing a gain of the amplifier for at least one bias condition of the amplifier. The evaluator is configured to obtain the linearity information based on both the information describing the gain of the amplifier and information about the at least one bias condition of the amplifier using a gain-bias characteristic of the amplifier. A bias circuit including the apparatus for providing the linearity information is also disclosed. A corresponding method for providing the linearity information includes: using the information describing the gain of the amplifier and the information about the at least one bias condition with the gain-bias characteristics to determine a relation of a current operating point described by the information with respect to the gain-bias characteristic; and deriving the linearity information from said relation.

25 Claims, 15 Drawing Sheets

APPARATUS AND METHOD FOR PROVIDING AMPLIFIER LINEARITY INFORMATION

FIELD

Some embodiments according to the invention are related to an apparatus for providing linearity information associated with an amplifier. Some embodiments according to the invention are related to a bias circuit for providing a bias condition to an amplifier on the basis of provided linearity information. Some embodiments according to the invention are related to a method for providing linearity information associated with an amplifier.

BACKGROUND

In the following, some examples of possible applications for measuring or determining a degree of linearity of an amplifier will be described.

Amplifiers are widely used in nearly any kind of electronic device. Depending on the intended use of the amplifier, a suitable amplifier design can be selected from a wide variety of amplifier designs developed and implemented to date. For example, an amplifier may be used in an output stage in order to drive some kind of transducer such as a loudspeaker, an antenna, a mechanical actuator, or a light source. An amplifier in an output stage is typically referred to as a power amplifier (PA) and is classified as class A, B, AB, and C for analog designs, and class D and E for switching design. These classes differ, among others, with respect to a degree of linearity that can be achieved and also with respect to their efficiency. For example, class A amplifiers are typically more linear than other types, but are very inefficient. A class C amplifier on the other hand offers the advantage of high efficiency, but a disadvantage is high distortion, i.e. the degree of linearity is relatively poor.

One field of technology in which PAs are widely used is the field of mobile telecommunication to drive the antennas of base transceiver stations or mobile devices. In both cases, power efficiency is the concern of the design process of the PA's. In the case of a PA used in a base transceiver station, the PAs make up a major part of the total power consumption, and thus often the operating costs of a base transceiver station. In a mobile device, improving the efficiency of the PA is desirable in order to achieve a longer battery life and/or standby time.

As mentioned above, improving the efficiency of a power amplifier typically results in a degradation of the linearity. Modern telecommunication standards, however, make relatively high demands on the linearity of devices operating under these standards in order to reduce inter-modulation. An excessive inter-modulation typically results in the output signal of the amplifier having a spectrum that contains frequencies which are not in the input signal, i.e. the spectrum is broadened. Typically, this effect is undesired because it results in the generation of jamming signals for other telecommunication systems and a waste of bandwidth.

One way of saving current in a transmitter for mobile communication is to "reduce the bias" of the PA to the minimum allowing the system to operate within the constraints dictated by the communication standard. All modulation types except GMSK (Gaussian Minimum Shift Keying) need a certain linearity to be guaranteed, therefore in an adaptive system capable of dynamically reducing the bias to control the consumption of DC-power, it is desirable to provide an effective and easy way of assessing the degree of linearity of the output signal.

Biasing in electronics is the method of establishing predetermined voltages and/or currents at various points of an electronic circuit to set an appropriate operating point. Linear circuits (or circuits operating in an approximately linear manner) involving transistors typically require specific DC voltages and currents to operate correctly, which can be achieved using a bias circuit. The bias voltage applied to a transistor in an electronic amplifier typically allows the transistor to operate in a particular region of its trans-conductance curve. Thus, the operating point and the corresponding bias voltage and/or current may preferably be selected so that the constraints suggested or even dictated by the communication standard are met at a relatively low level of biasing. The operating point at a corresponding bias setting may be implemented in a fixed, non-variable manner. The behavior of the amplifier varies, however, as a function of different variables such as temperature, power amplifier mismatch, level of output power, bias, and power amplifier specimen. At present a preliminary investigation of the signal-quality as a function of different variables is performed at laboratory by precision instruments. A fixed table for the best bias settings is then generated and used in the firmware of the products adopting that certain family of power-amplifiers.

SUMMARY

Some embodiments according to the invention provide an apparatus for providing a linearity information associated with an amplifier.

An apparatus according to an embodiment of the teachings disclosed in this document may comprise an operating state determinator configured to obtain information describing a gain of the amplifier for at least one bias condition of the amplifier. The apparatus may further comprise an evaluator configured to obtain the linearity information in dependence on both the information describing the gain of the amplifier and information about the at least one bias condition of the amplifier using a gain-bias characteristic of the amplifier.

In another embodiment according to the teachings disclosed herein, a bias circuit for providing a bias condition to an amplifier comprises an apparatus for providing a linearity information and a bias condition controller. The apparatus for providing a linearity information may comprise an operating state determinator configured to obtain information describing a gain of the amplifier for at least one bias condition of the amplifier and an evaluator configured to obtain the linearity information in dependence on both, the information describing the gain of the amplifier and the information about the at least one bias condition of the amplifier using a gain-bias characteristic of the amplifier. The bias condition controller may adjust the bias condition of the amplifier dependent on a value of the linearity information determined by the apparatus for providing the linearity information.

An apparatus for providing a linearity information associated with an amplifier according to another embodiment of the teachings disclosed herein may comprise an operating state determinator and a function value mapper. The operating state determinator may be configured to obtain information describing a gain of the amplifier for at least one bias condition of the amplifier. The function value mapper receives the information describing the gain of the amplifier and a corresponding bias condition. The function value mapper may be configured to map the information describing the gain and the corresponding bias condition to a corresponding value of the linearity information using a predetermined gain-bias characteristic.

Another embodiment according to the teachings disclosed in this document relates to an apparatus for providing a linearity information associated with an amplifier, the apparatus comprising a means for obtaining information describing a gain of the amplifier for at least one bias condition of the amplifier and a means for obtaining the linearity information in dependence on both the information describing the gain of the amplifier and information about the at least one bias condition of the amplifier, using a gain-bias characteristic of the amplifier.

According to another embodiment, a method for providing a linearity information associated with an amplifier comprises: obtaining information describing a gain of the amplifier for at least one bias condition of the amplifier; obtaining information about the at least one bias condition; and obtaining the linearity information in dependence on both the information describing the gain of the amplifier and the information about the at least one bias condition using a gain-bias characteristic of the amplifier.

According to another embodiment of the teachings disclosed herein, a method for providing a linearity information associated with an amplifier comprises: obtaining information describing a gain of the amplifier for at least one bias condition of the amplifier; obtaining information about the at least one bias condition; using the information describing the gain of the amplifier and the information about the at least one bias condition with a gain-bias characteristic to determine a relation of a current operating point described by the information describing the gain and the information about the bias condition with respect to the gain-bias characteristic; and deriving the linearity information from said relation.

An embodiment according to the teachings disclosed herein relates to a computer readable digital storage medium having stored thereon a computer program having a program code for performing, when running on a computer, a method for providing a linearity information associated with an amplifier, the method comprising: obtaining information describing a gain of the amplifier for at least one bias condition of the amplifier; obtaining information about the at least one bias condition; and obtaining the linearity information in dependence on both the information describing the gain of the amplifier and the information about the at least one bias condition using a gain-bias characteristic of the amplifier.

BRIEF DESCRIPTION OF THE DRAWINGS

Embodiments according to the teachings disclosed herein will subsequently be described with reference to the enclosed figures, in which.

DETAILED DESCRIPTION

In FIGS. 1 to 4 some relations between a gain, an input/output power, and a bias condition of a power amplifier will be illustrated and explained. The findings and/or insights obtained by studying these relations may be used in an apparatus for providing a linearity information according to the teachings disclosed herein.

Figure 1:
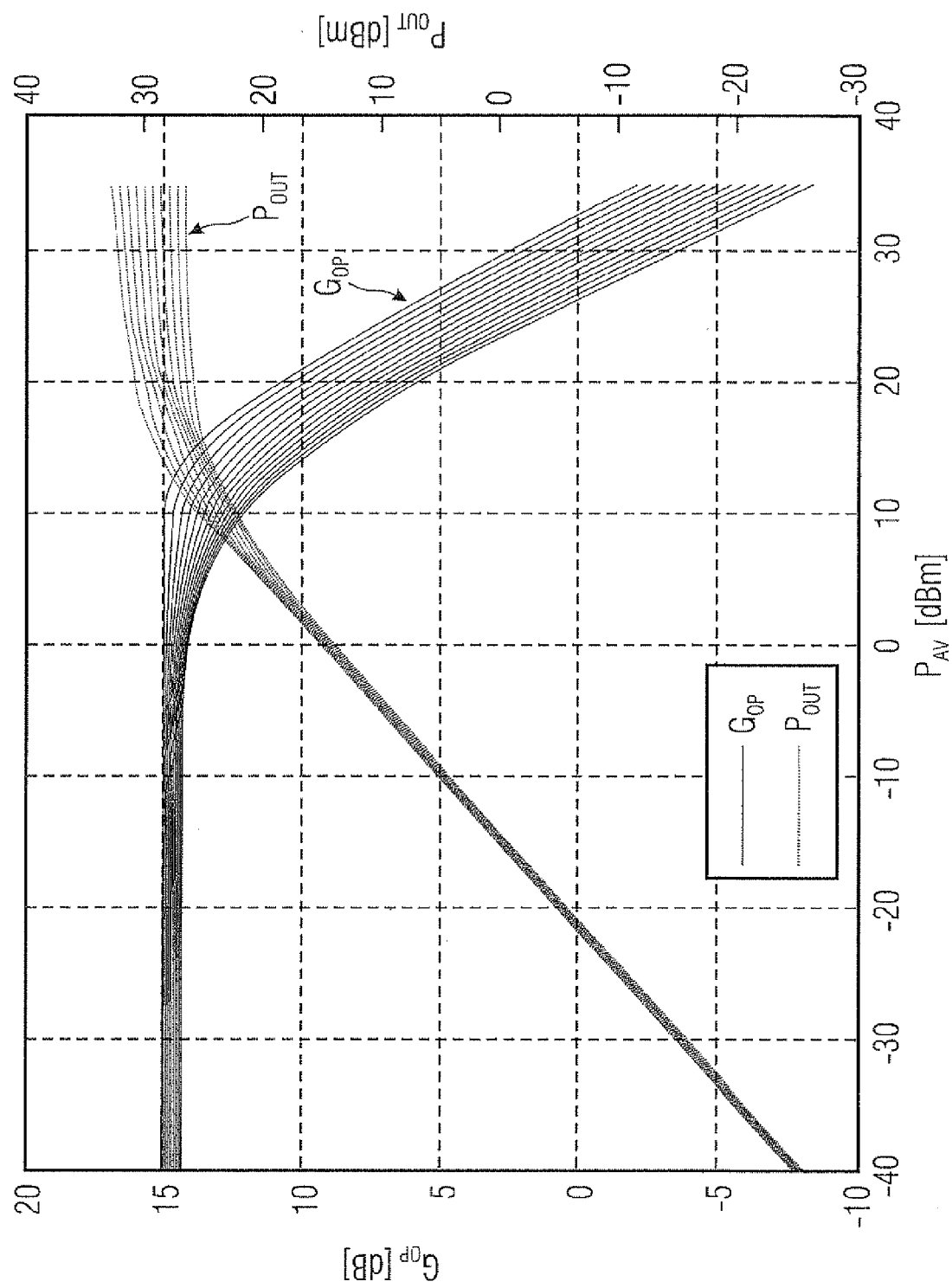
FIG. 1 shows a plot of the gain and the output power against available input power for different bias voltages.

FIG. 1 shows a combined plot of the gain $G_{OP}$ and of the output power $P_{OUT}$ against available input power $P_{AV}$ for different bias voltages of a typical amplifier. The unit of the gain axis is dB. The units of the available input power axes and the output power axes are dBm. It can be seen that up to an input power of approximately 0 dBm, the amplifier exhibits substantially linear behavior, since the gain is relatively constant at a value of approximately 15 dB and the output power $P_{OUT}$ increases linearly with increasing input power $P_{AV}$. In an input power range from 0 dBm and 10 dBm, the gain $G_{OP}$ begins to decrease for some of the curves that correspond to relatively low bias levels. For relatively high bias levels on the other hand, the gain is substantially constant in this region of the input power compared to input power $P_{AV}$ smaller than 0 dBm. For input powers $P_{AV}$ greater than approximately 12 dBm, a significant reduction of the gain $G_{OP}$ and a corresponding compression of the output power $P_{OUT}$ can be observed, regardless of the bias level of the amplifier.

FIG. 1 thus shows the behavior of a real amplifier which is only linear within limits. Accordingly, the output power $P_{OUT}$ increases with the input power $P_{AV}$ until a point is reached where some part of the amplifier becomes saturated and cannot produce anymore output; this is called clipping, and results in distortion. Before hard clipping occurs, a reduction in gain typically takes place in most amplifiers. The reduction in the gain is called "compression". In order to quantify the compression effect, a 1 dB compression point may be determined which is defined as the input power (or output power) where the gain is 1 dB less than the small signal gain.

Note that in FIG. 1, the curves corresponding to relatively high bias levels are above the curves corresponding to lower bias levels. Note further that the gain of the amplifier is typically different for different bias levels. Moreover, especially in the input power range from 0 dBm to approximately 12 dBm, the rate of change of the gain $G_{OP}$ over the available input power $P_{AV}$ (i.e., the slope of the gain curve) is different for the different bias levels.

Figure 2:
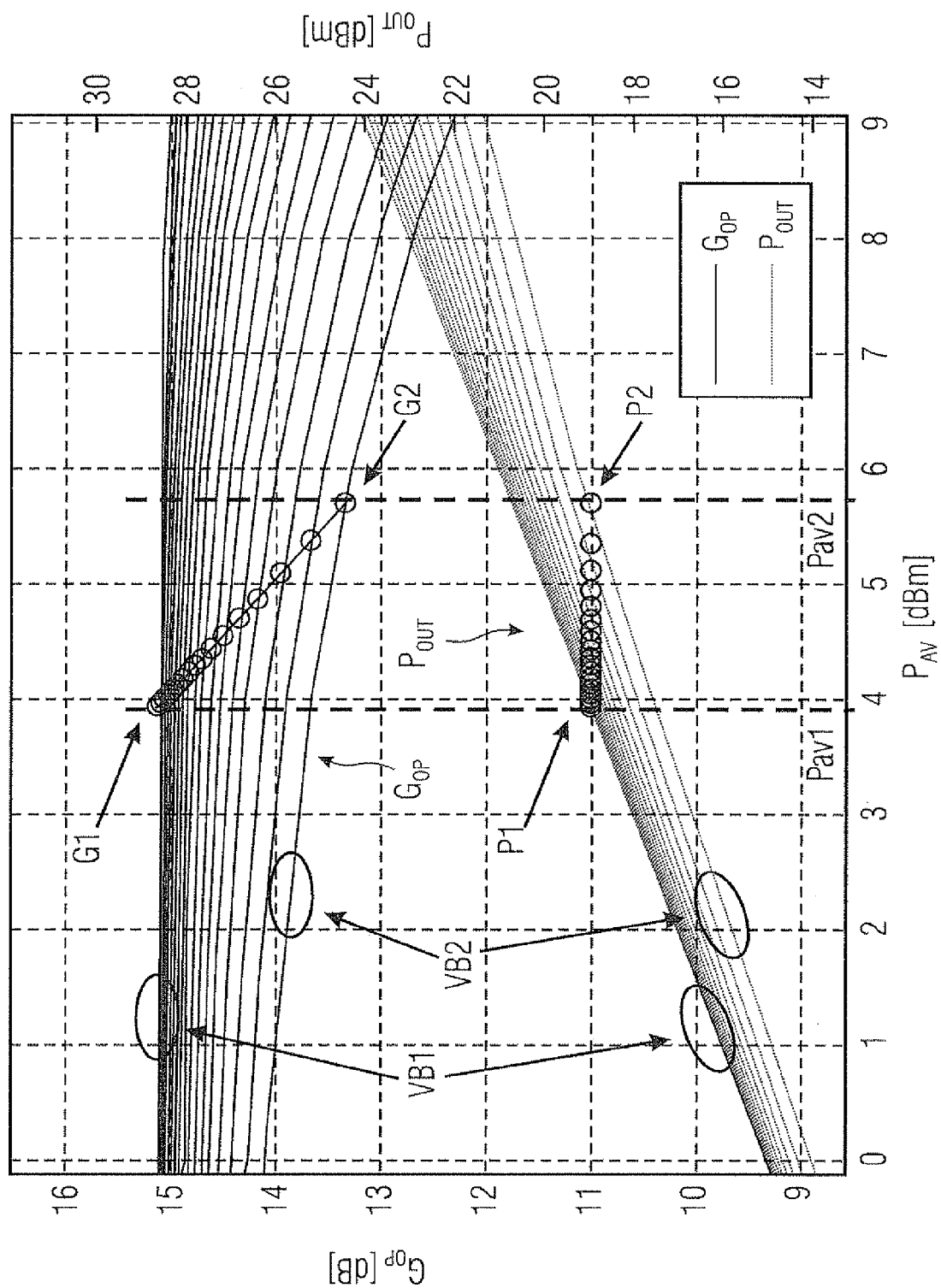
FIG. 2 shows an enlarged region of the plot of FIG. 1 and some auxiliary markings.

FIG. 2 shows an enlarged region of the plot shown in FIG. 1, in particular the input power range between 0 dBm and 9 dBm in which the rate of change of the gain $G_{OP}$ over the input power $P_{AV}$ exhibits a strong dependency on the bias level. The additional markings in FIG. 2 illustrate what happens when the bias is reduced from a value VB1 to a second value VB2, while the output power level is kept constant. It can be seen in FIG. 2 that in order to maintain the output power constant (P1=P2), the available input power has to increase from $P_{av1}$ to $P_{av2}$, since the gain dropped from G1 to G2. It can also be seen in FIG. 2 that especially for low bias levels, the gain $G_{OP}$ decreases as the input power $P_{AV}$ increases. The reason is that a relatively low bias level provides little head room for the input signal so that the amplifier is pushed into compression earlier than for higher bias levels.

Figure 3:
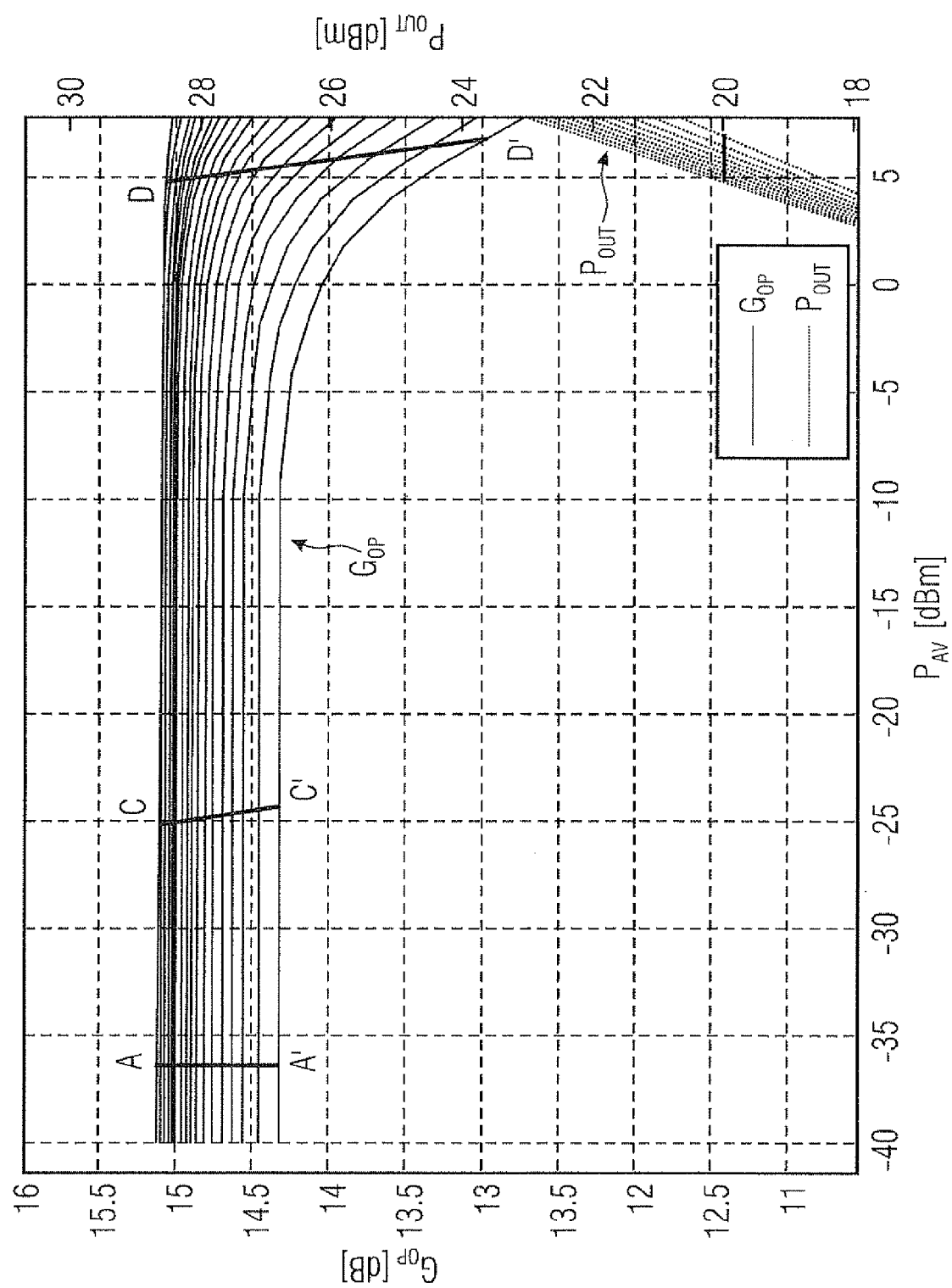
FIG. 3 shows another enlarged region of the plot of FIG. 1 and different trajectories for constant output power and small signal gain.

In FIG. 3 which shows another enlarged region of FIG. 1, two different trajectories C'C' and D-D' are traced on the gain curves for two different power output levels. For the trajectory C-C' the power amplifier remains clearly in linear operation. The gain curves are almost horizontal and far from the gain compression points which lie more to the right where the gain curves drop down with a knee. By looking at the section D-D' it is easy to notice that the first points on the trajectory are in linearity and how the reduction of bias pushes the PA more and more into compression as the operating point is moved towards D'.

Let us also consider the small-signal gain and its variations with the bias conditions. This can be represented as a trajectory A-A' in FIG. 3 for a very low available input power $P_{AV}$. By looking at the different trajectories and the different shapes of the gain curve for different bias conditions, the following observations can be made: the variation of the gain with respect to a variation of the bias condition depends on the available input power $P_{AV}$ that is currently fed to the amplifier. Furthermore, as the available input power $P_{AV}$ varies, the amount of how much the gain varies depends on the currently applicable bias condition. Note that the gain curves are all parallel where the PA is operating in a substantially linear manner.

Figure 4:
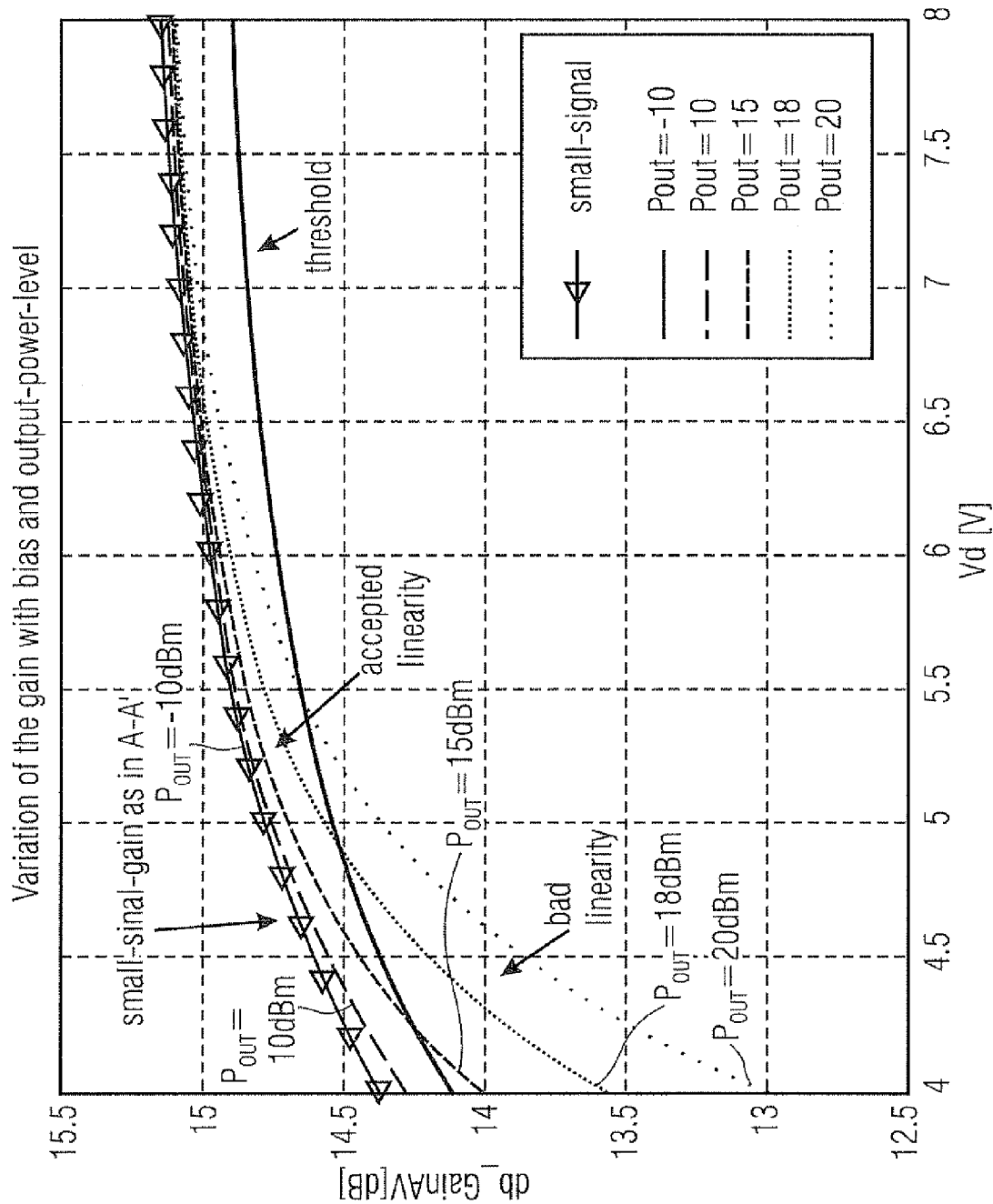
FIG. 4 shows a plot of different gain-bias characteristics at different output power and a corresponding threshold.

In FIG. 4, different gain trajectories are illustrated concurrently as a function of the bias together with the small signal gain. It is possible to see here that a threshold generated as an offset on the small signal gain can be set and used to assess the linearity degree of operation of the power amplifier. All the conditions above this threshold are accepted while those points, where the compression level is too high, are under this threshold. The apparatus or the method for providing the linearity information may thus determine whether the power amplifier currently operates in an acceptable operating condition. In case the apparatus or the method determines that the current operating condition of the power amplifier falls in the region beneath the threshold, a warning may be issued or the bias condition for the power amplifier may be adjusted. The uppermost curve (solid line with triangles and referenced by "$P_{out}$=−10 dBm") in FIG. 4 corresponds to the small signal case and corresponds to the trajectory A-A' in FIG. 3. This case is substantially equal to a case where the output power $P_{OUT}$ is −10 dBm. For a relatively high bias condition of 8 V of e.g. a drain voltage or a drain-source voltage Vd of a MOSFET transistor used in a source configuration of a single-stage amplifier, a small signal gain of 15.1 dB can be achieved, which corresponds to point A in FIG. 3. The point A' in FIG. 3 corresponds to a bias condition in which Vd=4 V. From FIGS. 3 and 4, it can be seen that the small signal gain is 14.4 dB at point A'.

For the sake of comparison, let us evaluate a gain-over-bias curve for a high output power level of $P_{OUT}$=20 dBm. According to FIG. 4, the gain is also approximately 15.1 dB for the high bias condition (Vd=8 V). With decreasing bias conditions, the gain degrades rapidly down to 13 dB for a bias voltage of Vd=4 V.

In FIG. 4, the threshold is offset from the small signal case by approximately 0.3 dB. Depending on the constraints imposed on the linearity of the amplifier, a smaller or a larger offset may be used, e.g. 0.1 dB, 0.2 dB, 0.4 dB, or 0.5 dB. The threshold may be used by the apparatus or the method for providing the linearity information to evaluate whether the power amplifier is currently operating in an acceptable operating point in terms of linearity and/or bias condition. To this end, the information describing the gain of the amplifier and the information about the bias condition may be evaluated against the threshold by the apparatus and/or the method according to the teachings disclosed herein. Typically, the information describing the gain and the information about the bias condition may be regarded as forming a value pair in a gain-bias plane. The threshold separates, in the gain-bias plane, a region of acceptable operating conditions from a region of sub-optimal operating conditions. The evaluation of the value pair against the threshold may be done by a comparator or comparison. The comparator or comparison may either implement a two-dimensional comparison function (in the gain-bias plane), or one of the variables (gain or bias condition) may be used to adjust a threshold for the other variable (i.e., bias condition or gain). When the apparatus or the method according to the teachings disclosed herein uses a threshold, the linearity information typically comprises a binary or discrete evaluation of the linearity of the power amplifier.

According to the teachings disclosed in this document, a way of detecting the quality of the signal at the output of a power amplifier (PA) by measuring the variation of the power gain of the power amplifier when the bias is changed will be presented in connection with the description relative to FIGS. 5 to 16. The proposed method is an alternative to e.g. a method that is based on determining a peak-to-RMS ratio.

The method described below and according to the teachings disclosed herein may be used, for example, in connection with an amplifier circuit in which the bias of the power amplifier can be dynamically varied, for example, by means of a DC-DC converter and in which the output power can be regulated by means of an open or a closed loop control or other similar control technique. Using an apparatus or a method as described herein, it is possible to track the linearity of the power amplifier when comparing the actual gain with the small signal gain of the power amplifier.

The determination of the linearity information according to the teachings disclosed herein in one embodiment is based on a measurement of the gain, therefore on measures of the average power of a signal, which means that there is no need to use a receiver in a feedback loop of the linearity measurement device. From feedback-design, it is known that it is typically easier to optimize a coupler for detection of the average power instead of for peak power. The coupler is typically arranged between an output of the amplifier and a load such as an antenna. Moreover, detection of the average power entails an integration operation which means that the signal-to-noise ratio will be higher if compared with measures on single points.

In a system where the output power level is constant, a variation of the gain corresponds to a variation on the input power level. This allows the tracking of the linearity just via measurement on the changes of the setting of the input power to the PA with relatively low costs in terms of computational complexity and time and without comparing input and output signals.

To summarize the above, the linearity of a PA can be determined thanks to measures of the gain-changes or input-power changes to the PA, which is exploited in the apparatus and the method for providing the linearity information. Suppose the PA is initially operated at a bias condition which ensures linearity. This may be achieved by controlling a bias circuit of the power amplifier to operate according to this bias condition, e.g., a relatively high bias voltage or current. The hypothesis of linearity is satisfied, as long as a preliminary characterization of the PA-family is run to fill in a table with "safe" bias values. The bias can subsequently be reduced in order to try and save DC-power and the gain-variation is observed and compared with that expected from a small-signal. When it starts deviating by a certain threshold, this means that the PA is being operated into compression. When a PA is being operated into compression, its gain is reduced for high input and/or output power, compared to the gain for smaller input/output power. This dependency of the gain on the input/output power affects the linearity of the power amplifier. The allowed degree of linearity of the output signal can be translated in an allowed degree of compression of the PA which entails a safe threshold in the gain-variation curve. In order to obtain the linearity information, the current operating condition of the power amplifier can be evaluated against the threshold, i.e. whether the current operating condition is above or beneath the threshold (or more generally: the relation of the current operating condition with respect to the threshold). In the embodiments described below, this may be achieved by using a comparator or a comparison action, which takes the operating condition and the threshold as inputs and provides the discrete linearity information as an output. Note that the threshold may be a threshold function or a threshold table in case the operating condition is a multi variable quantity, e.g., the information describing the gain and the information about the bias condition.

In connection with transmitters for mobile-phones, one embodiment of the method according to the teachings disclosed herein could be adopted together with PAs which are sufficiently insensitive to load-variation, or where mismatches at the antenna reference plane are well isolated from the PA-output reference plane. Another possibility would be to have a means of determining the mismatch, therefore, using this extra bit of information to set an adaptive threshold (see FIG. 11 and the corresponding descriptions for further details of such an implementation). If a trans-mission standard allows some empty slots during the communications, this time could be used to test the small-signal-gain and to adjust the threshold to changes of the matching conditions (see FIG. 10 and the corresponding descriptions for further details regarding this aspect of the teachings disclosed herein).

Figure 5:
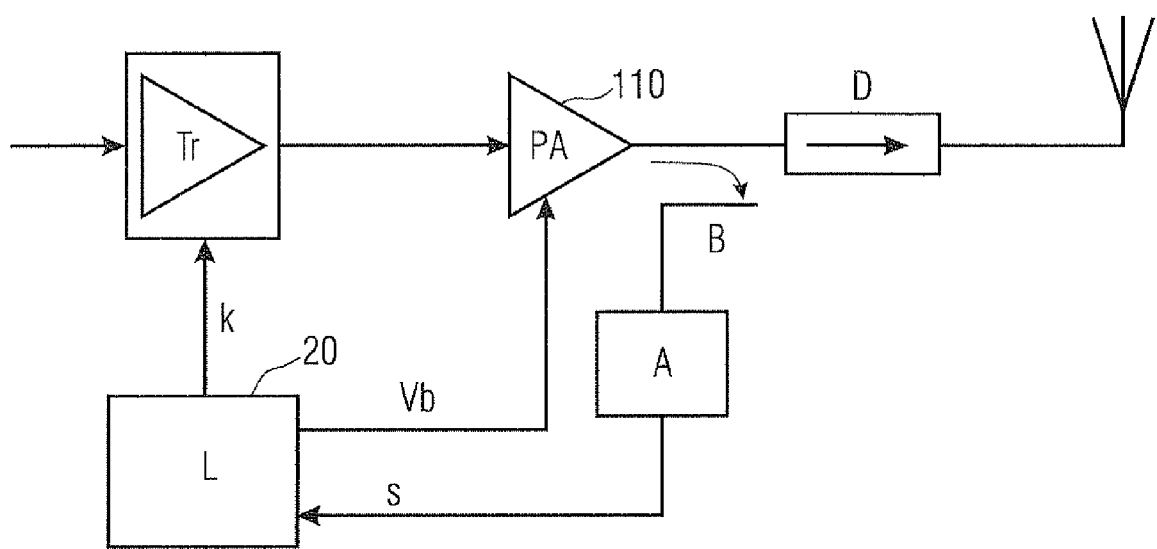
FIG. 5 shows a schematic block diagram of an architecture capable of exploiting the teachings disclosed in this document.

FIG. 5 shows an example of realization of an architecture capable of exploiting the teachings disclosed in this document. FIG. 5 shows an amplification chain as it could be used in a mobile phone, for example. A signal to be amplified is provided from the left to a transmitter Tr. The transmitter Tr processes the signal to be amplified which may comprise frequency modulation and filtering, for example. The signal processed by the transmitter Tr is then output as an input signal for a power amplifier 110. The input signal has a certain signal power which corresponds to the input power for the power amplifier 110. The input signal power can be controlled by the transmitter Tr in dependence on a control signal or control variable k which the transmitter Tr receives as a further input variable from a logic block L that will be explained below. The power amplifier 110 amplifies the input signal according to a certain gain factor to produce an amplified signal. The amplified signal is supplied to an antenna. The power amplifier 110 is, in the case illustrated in FIG. 5, isolated from the antenna by an isolator D, so that the impedance seen by the PA 110 is constant for all operating conditions, which entails that the small-signal-gain variation with bias is also fixed. The output path of the PA 110 is also coupled through a feedback B to a block A, whose functionality is that of generating a signal s proportional to the power of the coupled signal in order to represent the output power of the PA 110. To the simplest extent the block A could be a diode-detector. The block A provides the signal s to the logic block L.

The logic block L will then set the power-level at the output of the transmitter Tr (i.e. the power of the input signal for the power amplifier 110) thanks to the control signal k provided to the transmitter Tr so as to reach a targeted level of the signal s for a certain bias Vb. Accordingly, the output power of the power amplifier 110 is, in this case, controlled by a closed loop control with the targeted level of the power of the signal s as the set point and the control signal k as the actuating variable of the control loop. The logic block L also provides the bias Vb or a bias control signal for the power amplifier 110. Let us call $\hat{s}$, Vb1, k1 the triplet of values reached. The algorithm described in this document can then be implemented in the block L, as follows: For the target output power level detected by $\hat{s}$, the bias Vb can be reduced by a desired step to reach the value Vb2. In order to maintain $\hat{s}$, k has to rise to the value k2, i.e., the input power for the power amplifier 110 has to be increased. Thus, a check on the variation of k, with respect to the variation expected for small-signal-conditions against a certain threshold as in FIG. 4, leads to an estimate of the linearity of the PA 110. This step of reducing the bias condition can be reiterated to reach the desired threshold. In case of a further degradation of the linearity of the PA 110 being observed during the operation of the architecture depicted in FIG. 5 by the logic block L, the logic block L may increase the bias Vb again in a gradual manner or start over again at a safe bias condition.

By comparison to presently employed bias adjustment mechanisms a preliminary investigation of the signal-quality as a function of different variables is typically performed during the manufacturing of an architecture as shown in FIG. 5. A fixed table for the best bias settings is then generated and used in the firmware of the products adopting that certain family of power-amplifiers. It has been found that this table entails an overhead, namely that an extra-current-cost is generated by the inability of the system to adjust itself adaptively on the actual signal-quality. At least some of the teachings disclosed herein enable a (further) reduction of the bias condition and consequently of the power consumption by observing operating parameters of the power amplifier indicative of the amplifier's gain and its bias condition, and by setting the bias condition to a setting for which the power amplifier still operates in a sufficiently linear way, yet the bias condition is less power-consuming than in the fixed table case. In other words, by dynamically reacting to a current operating condition of the power amplifier, a safety margin for the bias condition of the power amplifier can be reduced while still operating the power amplifier in a substantially linear operating region.

Figure 6:
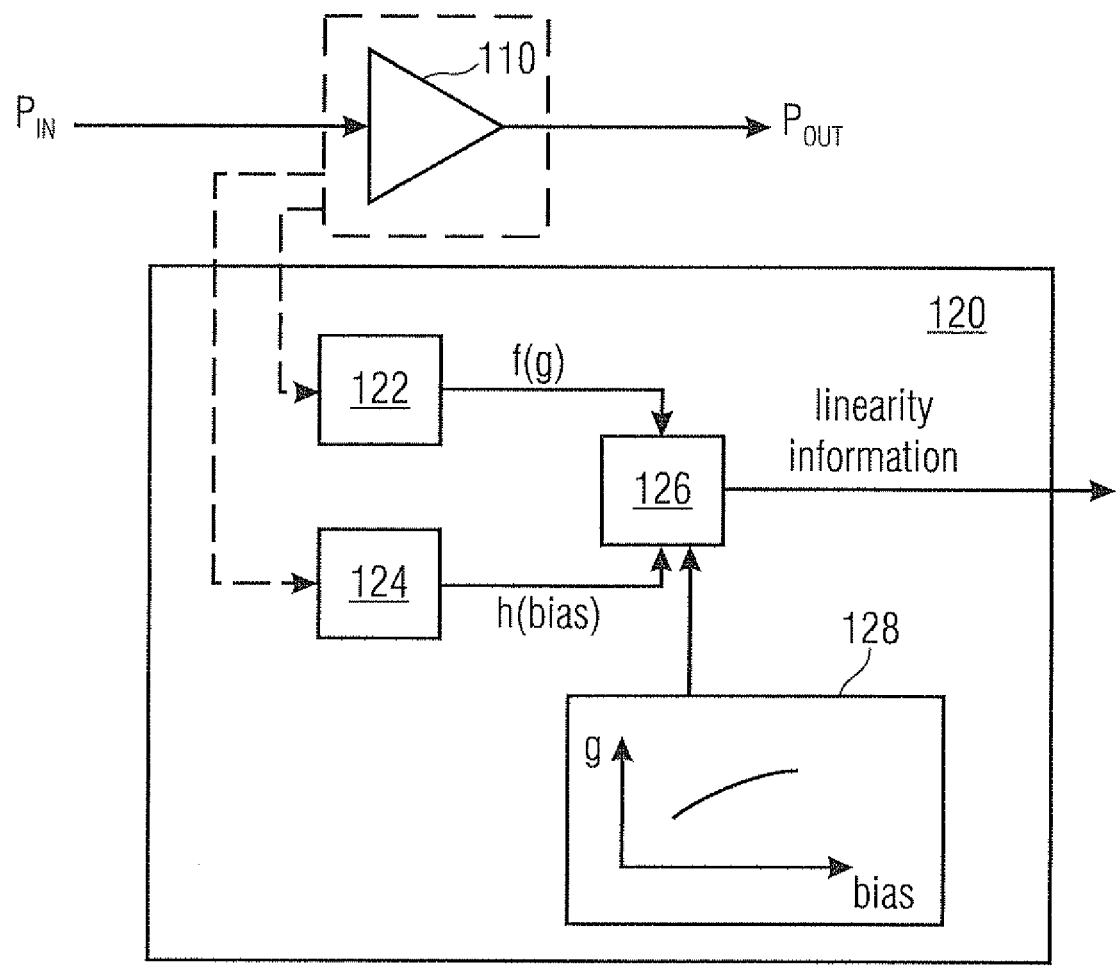
FIG. 6 shows a schematic block diagram of an apparatus according to an embodiment of the teachings disclosed herein.

FIG. 6 shows a schematic block diagram of a first embodiment of an apparatus for providing linearity information according to the teachings disclosed herein. The apparatus 120 may be used within the architecture as illustrated in FIG. 5, for example within the logic block L. The PA 110 receives an input signal to be amplified at an input of the PA 110. The input signal has an input power $P_{IN}$ which corresponds by and large to the available input power $P_{AV}$ illustrated in FIGS. 1 to 3. The input power $P_{IN}$ typically considers an AC portion of the input signal only while neglecting any quasi-DC components of the input signal caused by a bias voltage or a bias current applied to the input signal. At an output of the PA 110, an amplified output signal is provided with an output power $P_{OUT}$.

The apparatus 120 for providing the linearity information has two inputs which receive information relative to the PA 110, such as the information describing the gain of the PA and the information about the bias condition. The box around the PA 110 drawn in dashed line represents circuitry and/or variables that are involved in controlling the operation of the PA 110. The information received from the environment of the PA 110 are supplied internally to the apparatus 120 to an operating state determinator 122 and a bias condition determinator 124. The operating state determinator 122 is configured to obtain information describing a gain of the amplifier 110 for at least one bias condition of the amplifier. The bias condition determinator 124 is configured to obtain information describing a currently operating bias condition of the amplifier 110. For example, the bias condition determinator 124 may comprise a lowpass filter. The operating state determinator 122 provides the information describing the gain of the amplifier 110 as a value which is a function of the gain f(g). The value may be either the gain g itself or another quantity that is related to the gain of the amplifier 110, such as its input power $P_{IN}$, its output power $P_{OUT}$, the control parameter k of FIG. 5, or another suitable quantity. The bias condition determinator 124 outputs a quantity h(bias) which is a function of the current bias condition, such as a bias voltage or a bias current. Note that although the input of the apparatus 120 is shown as being directly connected to the input of the PA 110 in FIG. 6, this is not necessarily the case. Rather, a coupler could be provided. Note as well that in the embodiment shown in FIG. 6, the information f(g) describing the gain of the PA 110 is likely to be input power $P_{IN}$ for the PA 110. It is thus assumed that the output power $P_{OUT}$ is otherwise known, for example, because it is regulated by an open control loop or a closed control loop (not depicted).

The information f(g) describing the gain of the PA 110 and the quantity h(bias) are provided to an evaluator 126 which is configured to obtain the linearity information in dependence on both inputs provided to the evaluator 126 from the operating state determinator 122 and the bias determinator 124. The evaluator 126 also evaluates a gain-bias characteristic 128. The gain-bias characteristic 128 corresponds to an expected gain-bias characteristic or a default gain-bias characteristic of the amplifier 110. By qualitatively or quantitatively comparing an operating condition defined by the actual information describing the gain f(g) and the quantity describing the bias condition h(bias) with an operating condition defined by the expected gain-bias characteristic 128, the evaluator 126 may assess a currently valid degree of linearity. Thus, the evaluator 126 is configured to obtain the linearity information which may be used by other circuits or function blocks of e.g. a transmitter of a mobile device in a telecommunication network.

Figure 7:
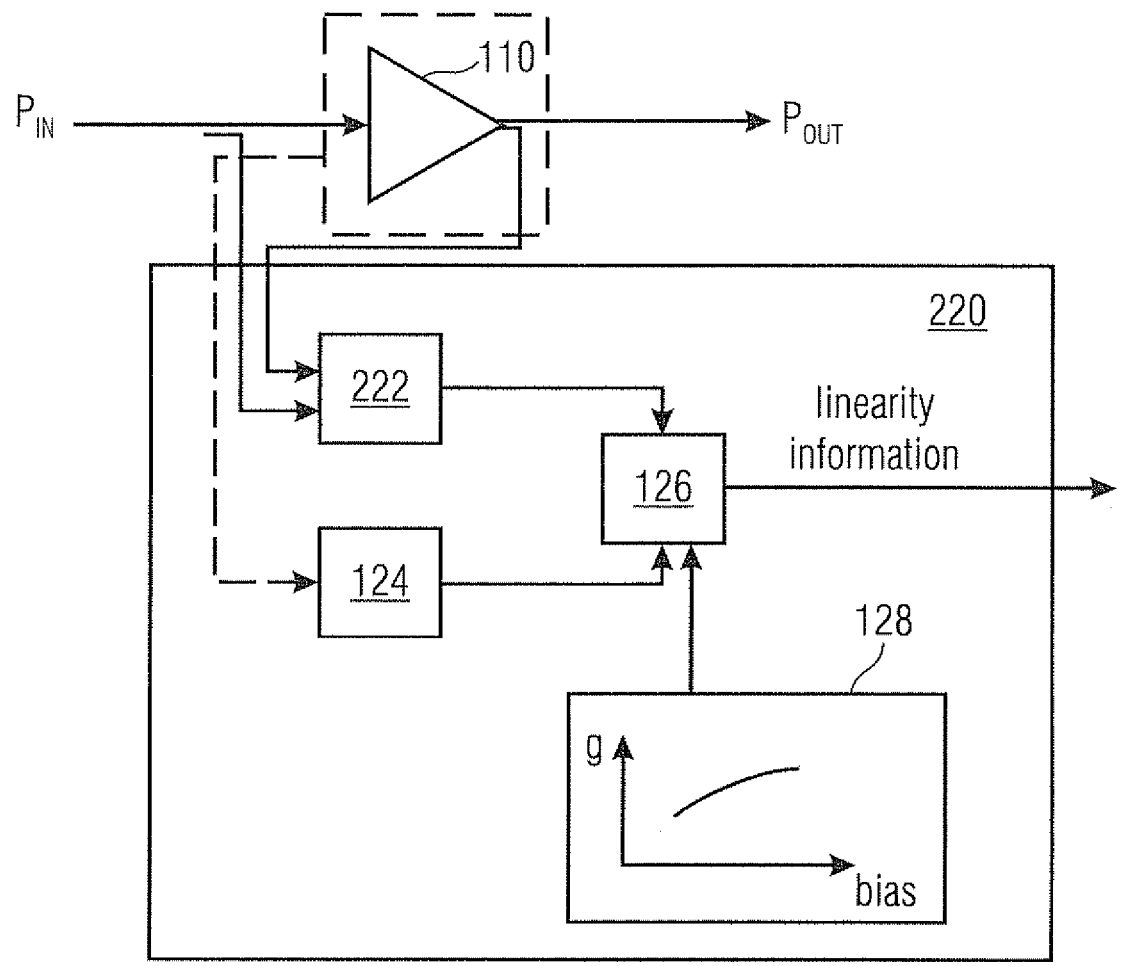
FIG. 7 shows a schematic block diagram of an apparatus according to another embodiment according to the teachings disclosed herein.

FIG. 7 shows a schematic block diagram of a second embodiment of an apparatus 220 for providing a linearity information associated with the amplifier 110. By comparison to the first embodiment shown in FIG. 6, the operating state determinator 222 of the apparatus 220 according to the second embodiment has two inputs, one for the input power $P_{IN}$ and for the output power $P_{OUT}$. The operating state determinator's input for the input power $P_{IN}$ is connected to a coupler arranged at an input side of the power amplifier 110. The operating state determinator's input for the output power $P_{OUT}$ is connected to a coupler arranged at an output side of the power amplifier 110. Other implementations for obtaining information about the input and output power are also possible and are contemplated by the present invention. The information f(g) describing the gain of the amplifier 110 may be obtained by evaluating a ratio of the output power $P_{OUT}$ and the input power $P_{IN}$. The purpose of the operating state determinator 122, 222 typically is to obtain a value for an average gain of the amplifier 110 over several periods or cycles of the input signal (or at least one period or cycle of the input signal). Therefore, the operating state determinator 122, 222 (and other operating state determinators described below with respect to subsequent figures), are typically not required to evaluate an instantaneous power of the input signal and/or the output signal of the amplifier 110. This fact typically simplifies an implementation of the operating state determinator.

The embodiment illustrated in FIG. 7 does not depend on the output power $P_{OUT}$ being regulated by means of a control loop. Rather, the input power $P_{IN}$ and the gain of the amplifier 110 could vary in an arbitrary manner, resulting in a corresponding output power $P_{OUT}$.

Generally, the information describing the gain of the amplifier may comprise at least one of an information about a gain factor of the amplifier directly, an information about an input power $P_{IN}$ of the amplifier, and an information about an output power $P_{OUT}$ of the amplifier 110. Furthermore, the information describing the gain may be a temporal average over a selected time span. Typically, the selected time span is longer than one period of the input signal, possibly by one or several orders of magnitude.

Figure 8:
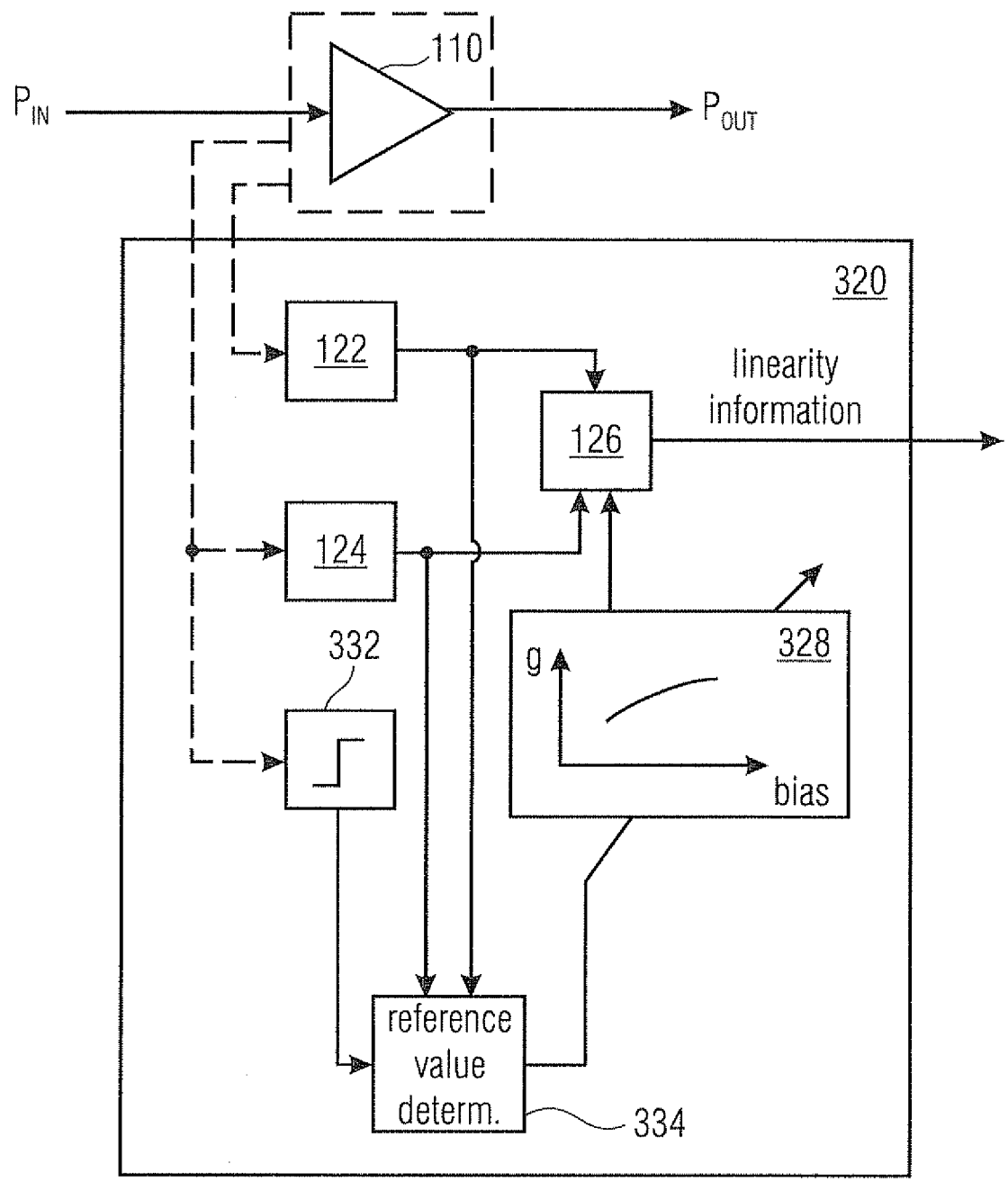
FIG. 8 shows a schematic block diagram of an apparatus according to yet another embodiment according to the teachings disclosed herein.

FIG. 8 shows a third embodiment of an apparatus 320 for providing the linearity information which is capable of adjusting or calibrating the gain-bias characteristic 328 to match the specific power amplifier 110 that is being used. The operating state determinator 122, the bias condition determinator 124, and the evaluator 126 are substantially identical or similar to the corresponding components shown in FIG. 6 and described in connection with FIG. 6. The apparatus 320 shown in FIG. 8 further comprises a reference value determinator 334 and a bias condition comparator 332. The reference value determinator 334 is configured to determine a first value of the information describing the gain corresponding to an operating state of the amplifier 110 in which the amplifier operates in a substantially linear mode. The reference value determinator 334 is further configured to adjust the gain-bias characteristic 328 so that the gain-bias characteristic substantially comprises the first operating point described by the first value and a corresponding bias condition, i.e., the gain-bias characteristic is shifted by the reference value determinator 334 so that the gain-bias characteristic passes through the point in the gain-bias plane defined by the first value of the information describing the gain and the corresponding information about the bias condition. To this end, the reference value determinator 334 comprises an input for the information describing the gain of the amplifier as output by the operating state determinator 122. The reference value determinator 334 further comprises an input for the information about the at least one bias condition as provided by the bias condition determinator 124.

In order for the reference value determinator 334 to know whether the amplifier 110 currently operates in the substantially linear mode, a linearity criterion may be evaluated. To this end, the bias condition comparator 332 is configured to compare the information about the at least one bias condition with a bias condition threshold that ensures a predetermined linearity. Recall from the discussion of FIG. 4 that a relatively high degree of linearity is obtained for a large range of input and output power values if the bias of the power amplifier 110 is sufficiently high. A comparison result of the bias condition comparator 332 indicates to the reference value determinator 334 whether the amplifier 110 operates in the substantially linear mode. When this is the case, i.e. the bias condition comparator 332 outputs the corresponding comparison result, a determination of the first value of the information describing the gain is triggered and the reference value determinator 334 samples the currently valid information describing the gain of the amplifier and also the currently valid information about the bias condition as provided by the operating state determinator 122 and the bias condition determinator 124, respectively.

The gain-bias characteristic 128, 328 is typically influenced by external and/or environmental parameters, such as temperature, supply voltage of the amplifier 110, amplifier mismatch, amplifier specimen, etc. The reference value determinator 334 and the bias condition comparator 332 allow to compensate for a systematic offset of the gain-bias characteristic 328 caused by external and/or environmental influences as mentioned above. While it is likely that the environmental, external influences also modifies the shape of the gain-bias curve, it may typically be reasonable to assume that a deviation between the expected gain-bias characteristic and an actual gain-bias characteristic caused by a modification of the shape of the curve is substantially negligible compared to a global offset of the gain-bias characteristic 328. Thus, the gain-bias characteristic may be adjusted to match a specific amplifier 110 by using a template gain-bias characteristic and applying an offset to this template gain-bias characteristic. This adjusting may be achieved by the reference value determinator 334 in connection with the bias condition comparator 332 as illustrated and explained in the exemplary embodiment of FIG. 8.

Thus, in case the bias condition happens to be sufficiently high for the amplifier 110 to operate in the substantially linear mode regardless of a level of the input power $P_{IN}$ and the output power $P_{OUT}$, the gain-bias characteristic 328 may be shifted up or down so that it passes through the currently valid operating point indicated by the reference value determinator 334, which in turn has received the currently valid operating point from the operating state determinator 122 and the bias condition determinator 124. As can be seen in FIG. 4, if the bias voltage Vd is greater than 7 V, the gain-bias characteristics for a large range of the output power level (from −26 dB to 20 dB) are all within a relatively narrow range for the gain of approximately 0.1 dB. The region where the gain-bias characteristics for various output power levels close in or are bundled in a relatively narrow gain range can be exploited by the reference value determinator 334. A template gain-bias characteristic may be determined by e.g. the manufacturer of the amplifier 110 and stored in a memory that is provided within the apparatus 320 or accessible by the apparatus 320.

Such a pre-stored gain-bias characteristic is believed to be sufficiently accurate at least for amplifiers 110 belonging to the same family of amplifiers. The template gain-bias characteristic may then be shifted in dependence on the currently valid information describing the gain of the amplifier and the currently valid information about the bias condition so that the shifted template gain-bias characteristic passes through an operating point described by these currently valid information. In this manner, the gain-bias characteristic may be adjusted to a particular amplifier at hand and/or to varying environmental conditions.

Figure 9:
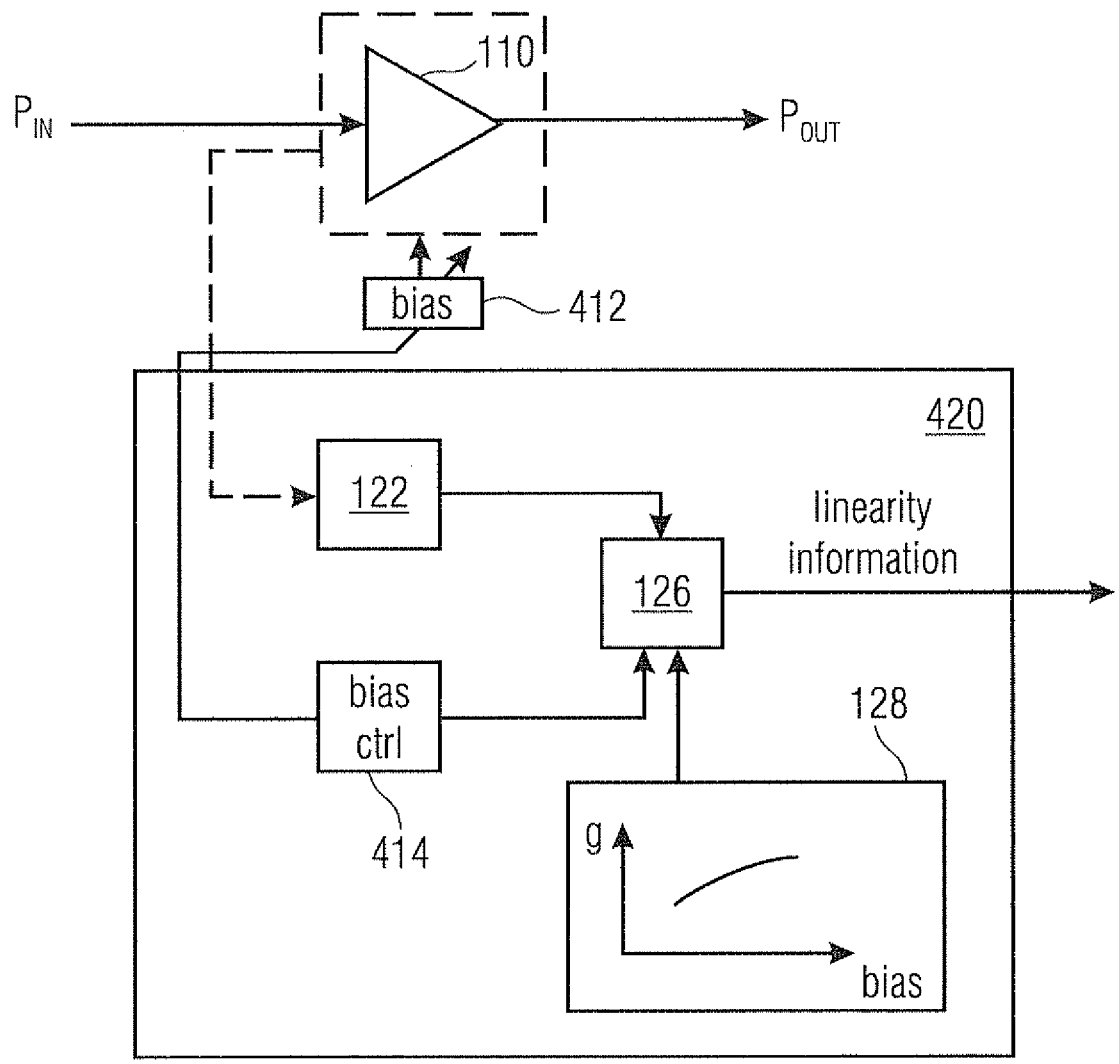
FIG. 9 shows a schematic block diagram of an apparatus according to a further embodiment of the teachings disclosed herein.

FIG. 9 shows a schematic block diagram of a fourth embodiment of an apparatus 420 for providing the linearity information associated with the amplifier 110. In this embodiment, the bias condition of the amplifier 110 may be set by the apparatus 420 so that the apparatus 420 may control the linearity of the amplifier 110. In FIG. 9, a bias circuit 412 is schematically illustrated as being connected to the input of the amplifier 110. The following types of bias circuits may be useful if the amplifier 110 comprises a bipolar transistor: fix bias (base bias), collector-to-base bias, fixed bias with emitter resistor, voltage divider bias, and emitter bias. For a field effect transistor, a typical bias circuit may, for example, set the drain voltage $V_d$ to a specific value defining the operating point of the field effect transistor. Generally, biasing methods may modify the operating point of an input signal to the amplifier 110 by means of a DC offset and/or set a specific value of a supply voltage of the amplifier 110.

The apparatus 420 comprises the elements of the apparatus 120 depicted in FIG. 6, that is, the operating state determinator 122, the evaluator 126, and an entity for providing the gain-bias characteristic 128. In addition, the apparatus 420 comprises a bias condition controller 414 which is configured to change the bias condition of the amplifier for causing the amplifier to attain at least two different values of the information describing the gain of the amplifier. The bias condition controller 414 is connected to the bias circuit 412 in order to set the bias circuit 412 to one of at least two different bias conditions. To this end, the bias circuit 412 may, for example, comprise one or more variable components such as resistors, capacitors, or the like to set or regulate a bias voltage or a bias current, such as a base-emitter voltage $V_{BE}$, a gate-source voltage $V_{GS}$, a collector-emitter voltage $V_{CE}$, a drain-source voltage $V_{DS}$, a collector current $I_C$, and/or a drain current $I_D$. It is also possible that the bias circuit 412 comprises one or more switches that are controlled by the bias condition controller 414. The switch(es) would then select among two components having different nominal values to be activated for producing a specific bias condition of the amplifier 110. Another option would be to selectively connect, disconnect, or short-circuit a certain component such as a resistor or a capacitor in order to change the configuration of the bias circuit 412.

The bias condition controller 414 may periodically adjust the bias condition for the amplifier 110. The bias condition controller 414 may start off at a relatively high bias condition which typically ensures a substantially linear operation of the amplifier 110. Hence, the bias condition controller 414 may be configured to set the bias condition to a comparatively high bias value and (subsequently) to a lower bias value. The evaluator 126 may be further configured to determine a deviation between a) a value describing the gain of the amplifier at the lower bias value, and b) a previously determined value describing the gain of the amplifier at the lower bias value for a small-signal case (see FIG. 15 and corresponding description). Furthermore, the evaluator 126 may also be configured to determine the linearity information as a function of the determined deviation. The evaluator 126 may exploit the at least two different values of the information describing the gain of the amplifier 110 and the at least two corresponding bias conditions.

The bias condition controller 414 may be arranged for changing the bias condition in an iterative manner until at least one of the information describing the gain and the bias condition reaches, or exceeds, a threshold defined by the gain-bias characteristic 128. Alternatively, the bias condition may be changed until an operating condition defined by an information describing the gain and an information about the bias condition reaches a predetermined region of the gain-bias characteristic. To this end, the bias condition controller 414 may exploit the linearity information, or a corresponding signal may be sent by the evaluator 126 to the bias condition controller 414.

Figure 10:
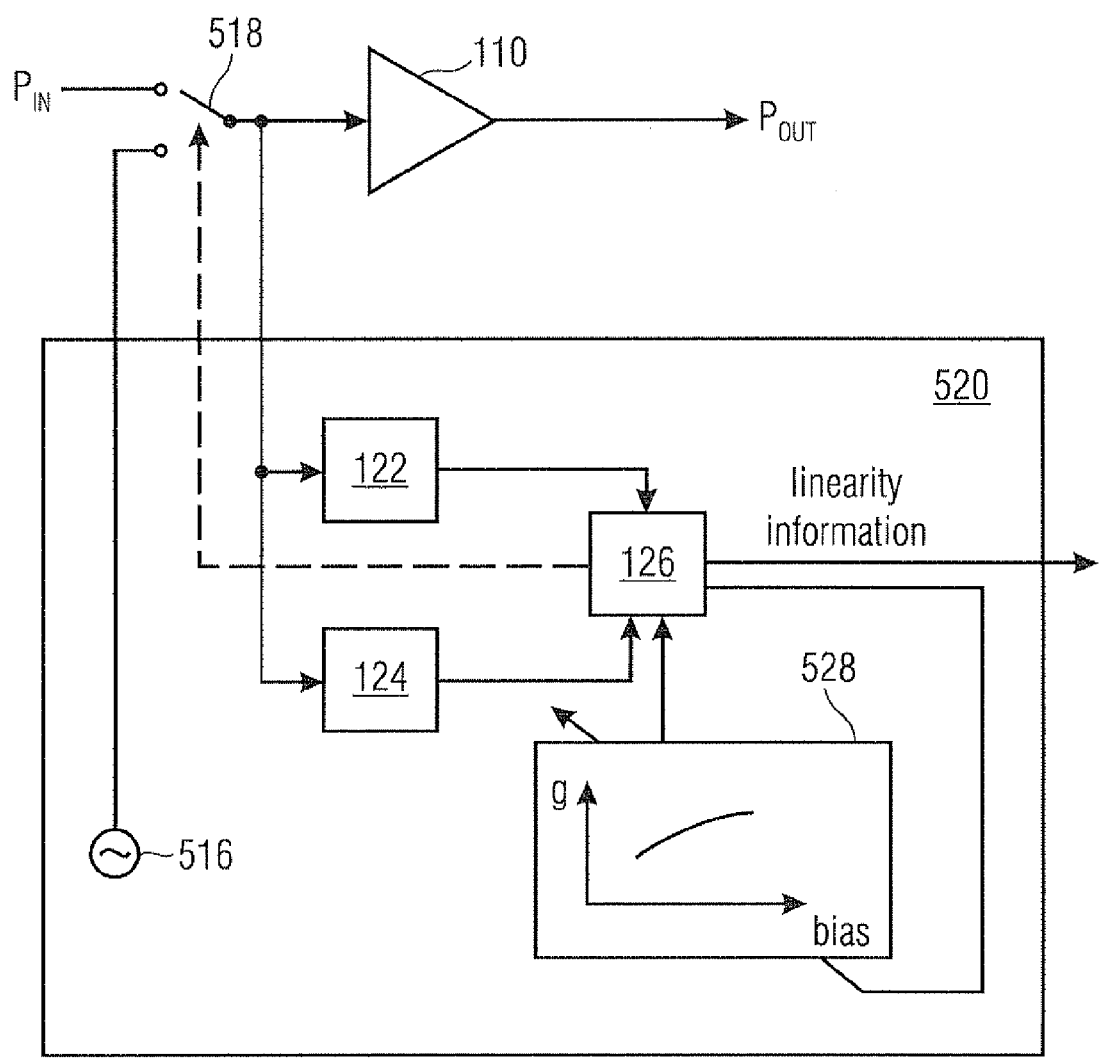
FIG. 10 shows a schematic block diagram of an apparatus according to another embodiment of the teachings disclosed herein.

FIG. 10 shows a schematic block diagram of a fifth embodiment of an apparatus 520 for providing the linearity information associated with the amplifier 110. The apparatus 520 substantially fulfills the functionality of the apparatus 120 from FIG. 6, but is extended to produce a small-signal gain-bias characteristic by itself. Thus, the apparatus 520 does not rely on a predetermined, stored small-signal gain-bias characteristic, but may determine the actual small-signal gain-bias characteristic of the amplifier 110 at hand. The small-signal gain-bias characteristic thus obtained may then be used within the entity providing the gain-bias characteristic 528 and, consequently, assist the evaluator 126 in providing the linearity information. The apparatus 520 comprises a signal generator 516 which is configured to generate a suitable small-signal input for the amplifier 410. The selector 518 in the form of a two-way switch is connected to the input of the amplifier 110. The selector 518 allows the input of the amplifier 110 to be connected with a normal operating state input for a payload signal (designated by the reference sign $P_{IN}$ for the power of the input signal), or with an output of the signal generator 516. The selector 518 is controlled by the evaluator 126 in the embodiment illustrated in FIG. 10. The evaluator 126 acts as a gain-bias characteristic provider for providing a small-signal gain-bias characteristic of the amplifier 110. By controlling the selector 518, the evaluator 126 knows when the suitable small-signal input is applied to the amplifier 110 and can therefore derive the small-signal gain-bias characteristic of the amplifier 110 by sampling value pairs of the information describing the gain of the amplifier 110 and the information about the currently valid bias condition of the amplifier 110. The information gathered in this manner, i.e. in the form of one or more value pairs, may then be used to adjust the gain-bias characteristic 528. Some communication standards under which a mobile phone or a base transceiver station operate, define time slots in order to organize the transmission from different transmitters. Therefore, a transmitter typically has some idle time. This idle time may be used to set the selector 518 to the configuration in which the small-signal input is applied to the amplifier 110. As it is a small signal, the output power $P_{OUT}$ of the amplifier 110 will not be very high and therefore will not produce a strong output signal that could be radiated by an antenna connected to the amplifier 10. Thus, probing the amplifier 110 with the small-signal input will practically not result in jamming the remote transmitter(s) that are scheduled to transmit during a specific time slot.

The embodiment shown in FIG. 10 could be combined with the fourth embodiment shown in FIG. 9, so that each time the evaluator 126 controls the selector 518 to connect the small-signal input with the amplifier 110, a new bias condition is set by the bias condition controller 414 and the bias circuit 412. In this manner, the small-signal gain-bias characteristic (illustrated in FIG. 4) of the amplifier 110 may be determined for a plurality of bias conditions.

Figure 11:
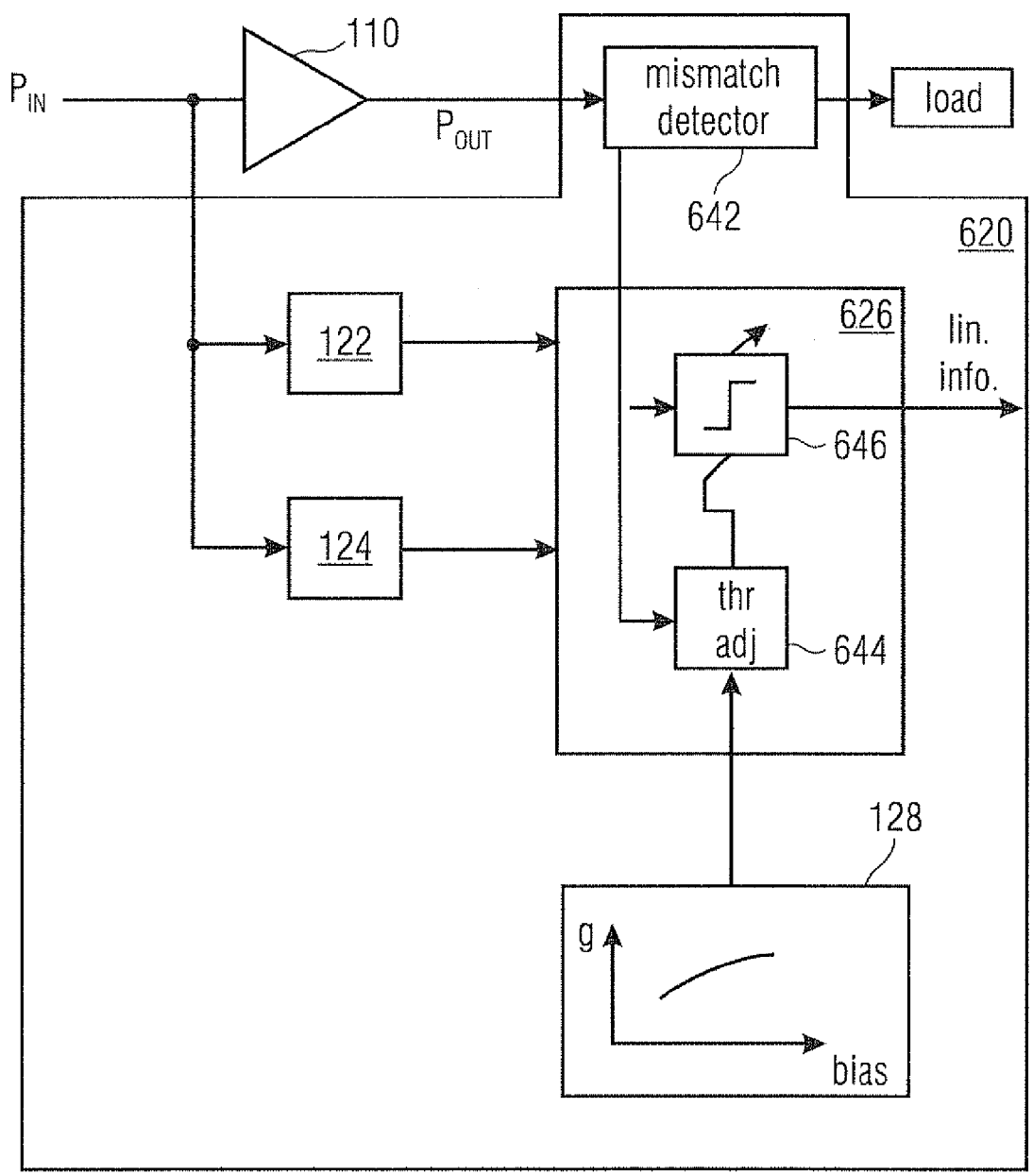
FIG. 11 shows a schematic block diagram of an apparatus according to a further embodiment of the teachings disclosed herein.

FIG. 11 shows a sixth embodiment of an apparatus 620 for providing the linearity information associated with the amplifier 110. The sixth embodiment takes into account a degree of mismatch between the amplifier 110 and a load connected to the output of the amplifier when determining the linearity information. A high degree of mismatch may result in a degradation of the linearity of the amplifier 110 so a knowledge about the current degree of mismatch may improve the accuracy of the linearity information. The apparatus 620 comprises a mismatch detector 642 which is connected between an output of the amplifier 110 and a load that is fed by an output signal of the amplifier 110. The evaluator 626 comprises a threshold adjustor 644 and a comparator 646. An output of the mismatch detector 642 is connected to the threshold adjustor 644 for using the determined amount of mismatch for adjusting a threshold gain-bias characteristic. Another input to the threshold adjustor 644 is provided by the entity providing the gain-bias characteristic 128. The threshold adjustor 644 modifies a threshold that is evaluated by the comparator 646 in dependence on a result provided by the mismatch detector 642. For example, the higher the mismatch between the amplifier 110 and the load, the larger a safety margin for the linearity information could be chosen and the threshold would be shifted to higher gain values, towards the small-signal gain-bias characteristic. The comparator 646 typically compares at least one of the information describing the gain and the information about the bias condition with the threshold provided by the threshold adjustor 644.

Figure 12:
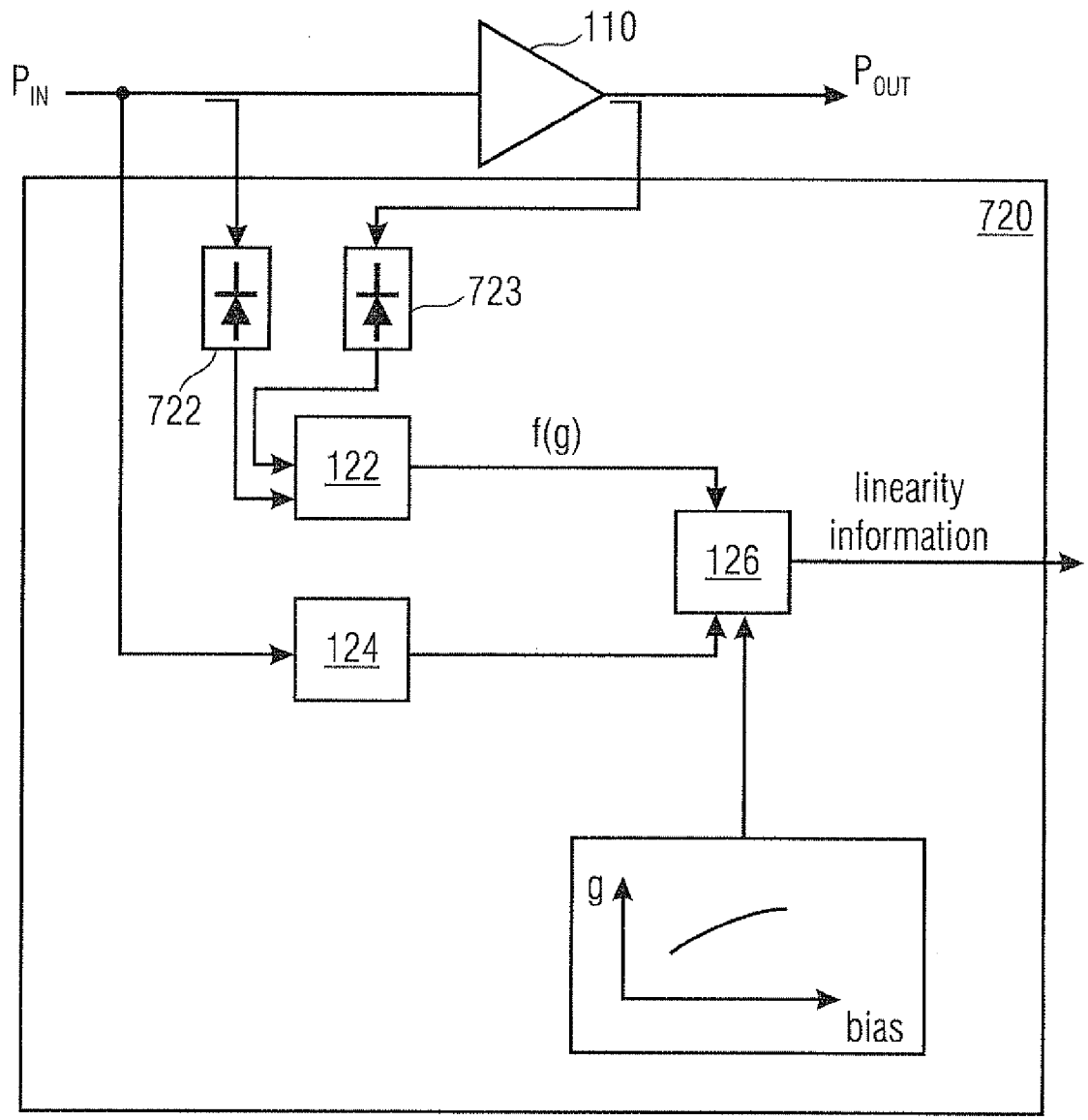
FIG. 12 shows a schematic block diagram of an apparatus according to another embodiment of the teachings disclosed herein.

FIG. 12 shows a seventh embodiment of an apparatus 720 according to the teachings disclosed herein which comprises provisions for obtaining the information describing the gain by means of measuring the input and output power of the amplifier 110. The apparatus 720 comprises an input power detector 722 for detecting an input power of the amplifier 110 and an output power detector 723 for detecting an output power of the amplifier 110. The operating state determinator 122 is connected to the input power detector 722 and the output power detector 723. The operating state determinator 122 is further configured to derive the information describing the gain of the amplifier from at least one of an information about the input power and an information about the output power provided by at least one of the input power detector 722 and the output power detector 723, respectively. The inputs of the power detectors 722, 723 may be connected to couplers at an input side and an output side of the amplifier 110, respectively.

Figure 13:
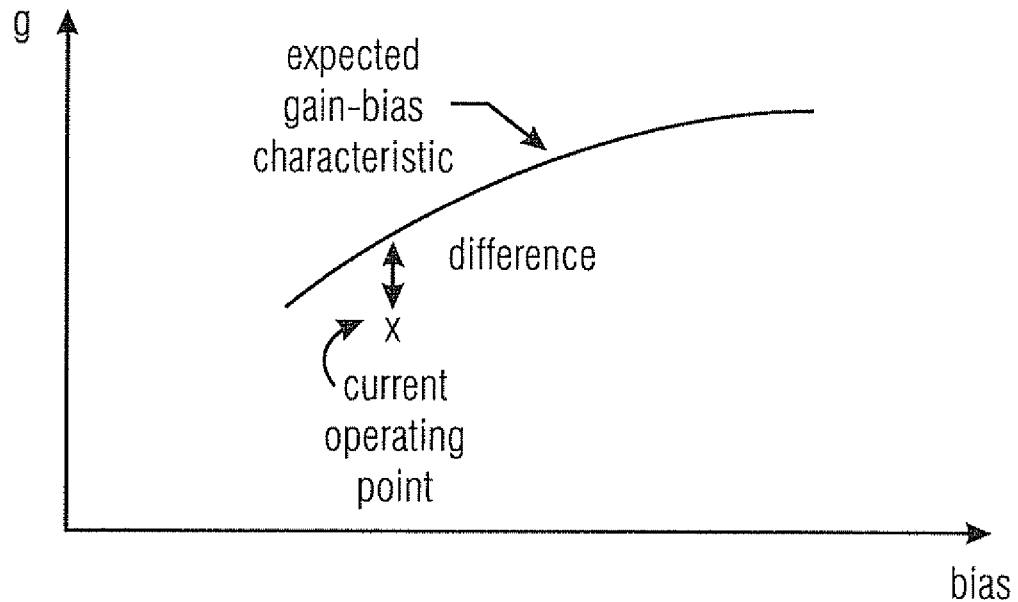
FIG. 13 shows a schematic plot of a gain-bias characteristic to illustrate a first option of using the gain-bias characteristic.

FIG. 13 illustrates a schematic plot of an expected gain-bias characteristic. Furthermore, a current operating point of the amplifier 110, defined by the information describing the gain of the amplifier and the information about the bias-condition of the amplifier, is also depicted in FIG. 13. A relation of the current operating point with respect to the expected gain-bias characteristic can be seen in FIG. 13 as the difference of the gain between the current operating point and the expected gain-bias characteristic. As could be seen in the context of FIG. 4, this difference can be used within the evaluator 126 as a measure for the linearity of the operation of the amplifier 110. The expected gain-bias characteristic may be regarded as corresponding to a substantially linear operation of the amplifier 110. The evaluator 126 may thus be configured to determine said difference and to derive the linearity information from the determined difference between the expected gain-bias characteristic and the current operating point.

Figure 14:
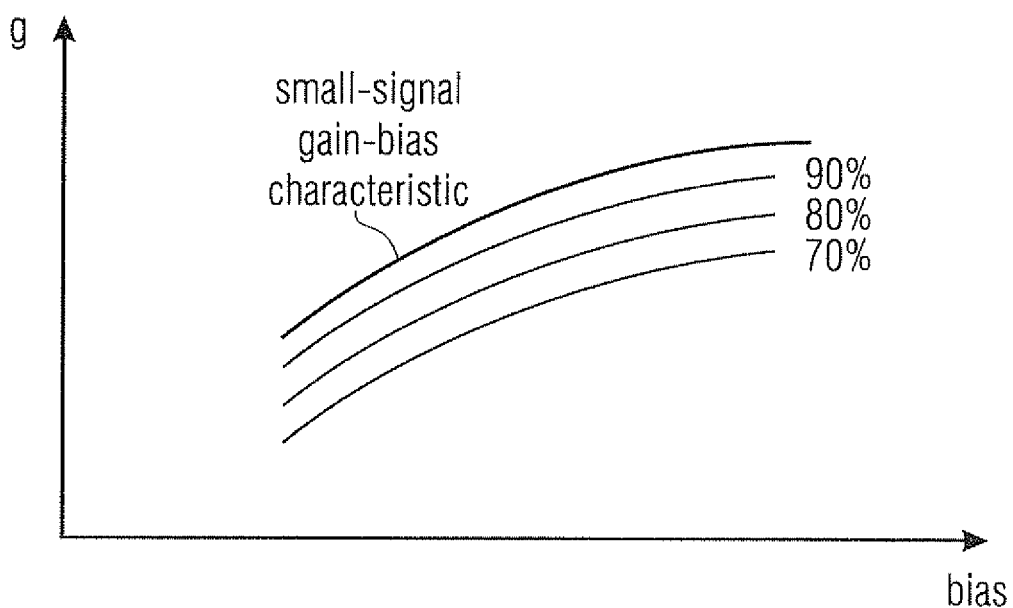
FIG. 14 shows a schematic plot of a gain-bias characteristic to illustrate a second option of using the gain-bias characteristic.

FIG. 14 shows another schematic plot of the gain-bias characteristic. The upper thick line in the diagram of FIG. 14 shows the small-signal gain-bias characteristic of the amplifier 110 which is either known from laboratory measurements and stored for being used by the evaluator 126, or dynamically determined as described in some of the previous embodiments. Beneath the small-signal gain-bias characteristic, three threshold lines are depicted which have substantially the same shape as the small-signal gain-bias characteristic, but are offset from the latter by a certain amount. These threshold lines may be regarded as "iso-lines" for the linearity information according to some scalar measure of the linearity of the amplifier 110. A first line corresponds to 90% linearity, a second line corresponds to 80% linearity, and a third line corresponds to 70% linearity. The linearity information can thus be derived from these lines by comparing the current operating point with the various threshold lines to determine whether an operating point defined by the information describing the gain and the information about the bias condition is in a region above or below one of the lines, or in a region between two of the lines. The linearity information is provided in dependence on the results of the comparison(s) between the current operating point and the threshold line(s).

A function value mapper may be used to evaluate a current operating point of the amplifier 110 with respect to the plot shown in FIG. 14. The function value mapper may be a part of the evaluator 126 and configured to receive the information describing the gain of the amplifier 110 and a corresponding bias condition. The function value mapper may further be configured to map the information describing the gain and the corresponding bias condition to a corresponding value of the linearity information (or to an acceptable/unacceptable information) using a predetermined (or previously set) gain-bias characteristic as illustrated in FIG. 14. A possible implementation of the function value mapper is that the function value mapper evaluates in which region of the gain-bias plane the current operating point is located. The function value mapper could alternatively determine the linearity information in an analytical manner using an approximated function which maps the gain-bias plane to the linearity information. Evaluating the operating point against one or several threshold lines as they are shown in FIG. 14 corresponds to subdividing the gain-bias plane into a plurality of sub-regions in which the linearity is acceptable or not acceptable.

Figure 15:
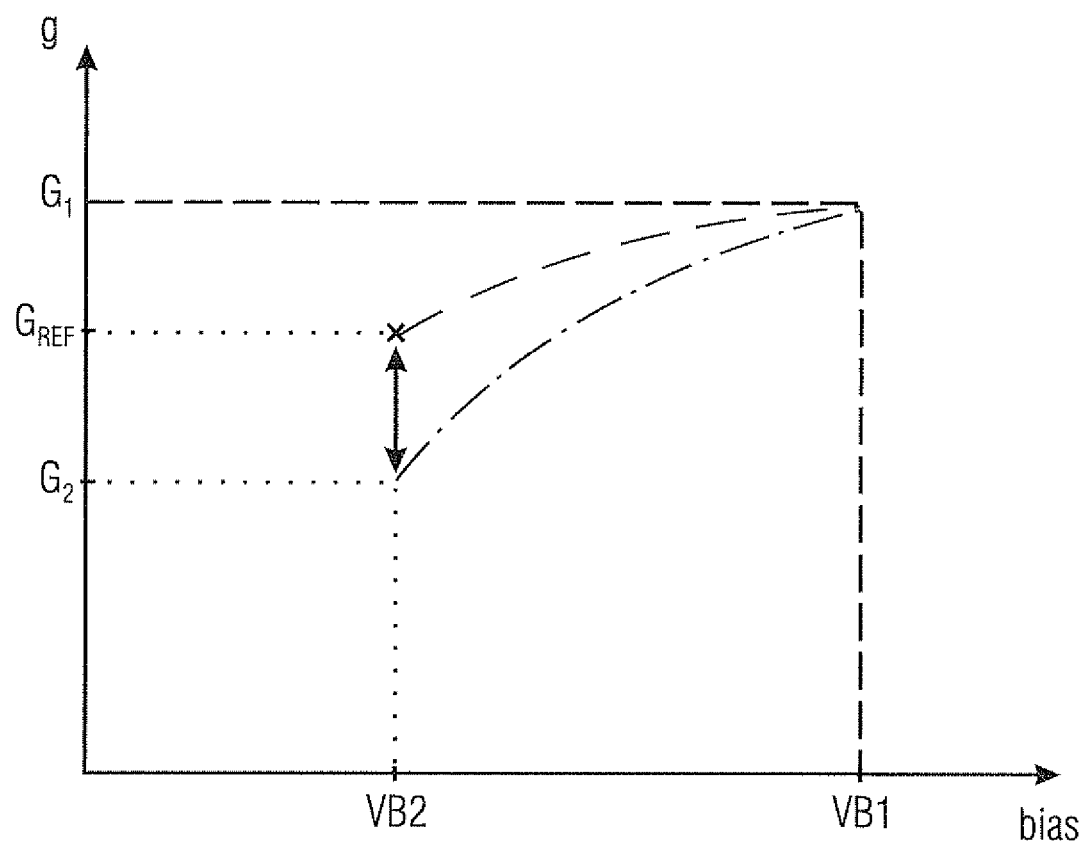
FIG. 15 shows a schematic plot of the gain-bias characteristic to illustrate a third option of evaluating the gain-bias characteristic.

FIG. 15 shows another schematic plot of two different gain-bias characteristics of the amplifier 110 for different output powers. The first gain-bias characteristic is drawn in a dashed line and corresponds to a small signal gain-bias characteristic. The second characteristic is drawn in dashed-dotted line and corresponds to a gain-bias characteristic for a certain output power $P_{OUT}$ of the amplifier 110. Both characteristics are approximately equal at an operating point (VB1, $G_1$). As the bias voltage is reduced from VB1 to VB2, the small signal gain-bias characteristic shows that the gain is also reduced to a value $G_{REF}$. For the non-small-signal case (dashed-dotted line) the gain has dropped farther to a value $G_2$. Since the small-signal case corresponds to a substantially linear mode of operation of the amplifier 110, the deviation between $G_2$ and $G_{REF}$ can be used within the evaluator 126 to determine the linearity information. In particular, the evaluator 126 may receive the small-signal gain-bias characteristic from the entity that provides the gain-bias characteristic 128, 328, 528. Then the value of the gain-bias characteristic 128, 328, 528 is evaluated for a value VB2 of the bias condition indicated by the information about the bias condition as received from the bias condition determinator 124 or the bias condition controller 414. The gain value $G_{REF}$ thus obtained for the small-signal case is then compared to the actual gain value $G_2$ as indicated by the information describing the gain which is provided by the operating state determinator 122. The evaluator 126 may comprise a comparator or a subtractor that implements this comparison. The comparison may comprise the determination of a difference $G_{REF}-G_2$. The value VB1 of the bias-voltage corresponds to a relatively high bias value and the value VB2 corresponds to a lower bias value. The gain value $G_2$ corresponds to a value describing a gain of the amplifier at the lower bias value. The gain value $G_{REF}$ corresponds to a previously determined value describing the gain of the amplifier at the lower bias value VB2 for a small-signal case. Thus, it is possible to determine the linearity information as a function of the determined deviation $G_{REF}-G_2$ i.e., on the result of the comparison or the subtraction performed by the comparator or the subtractor within the evaluator 126. The linearity information may then be output by the evaluator 126 and the apparatus 120, 320, 520.

Figure 16:
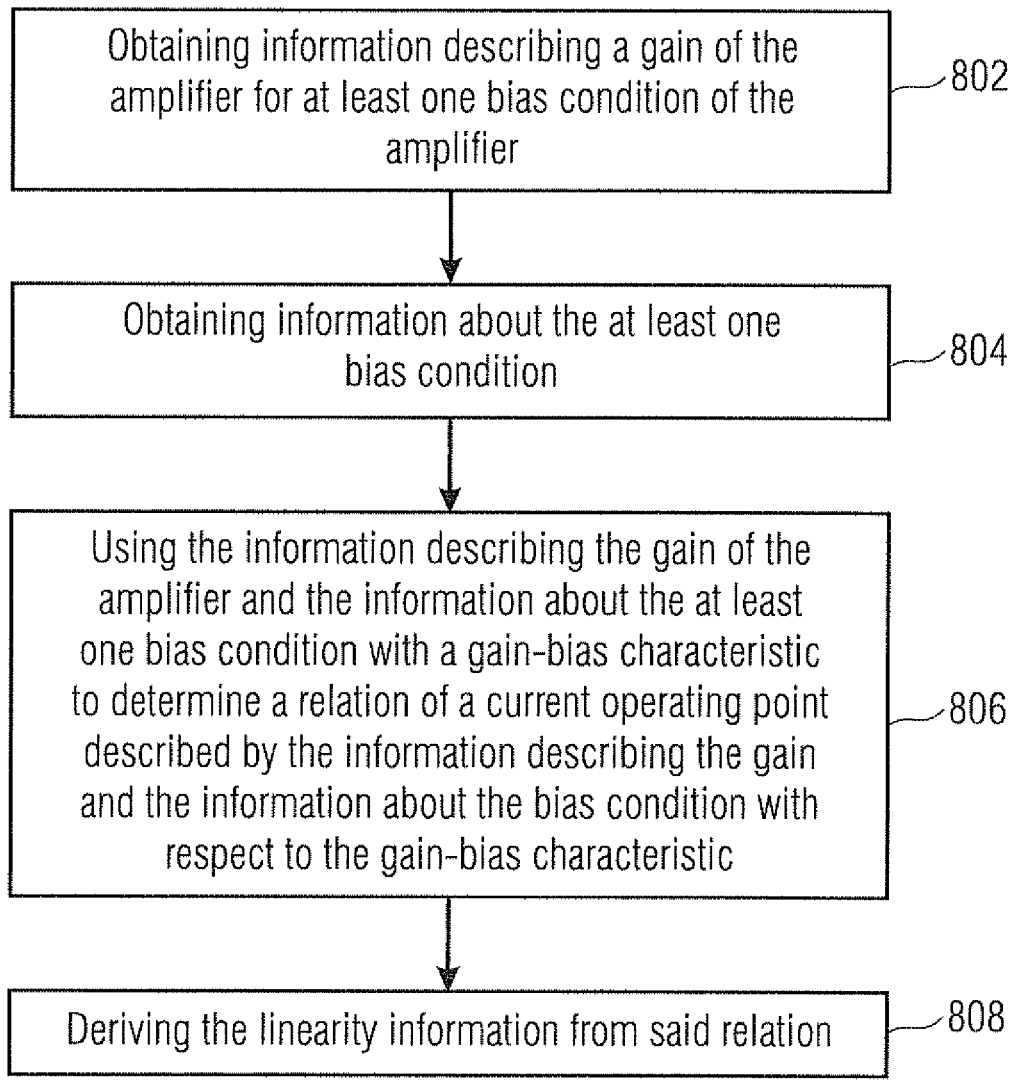
FIG. 16 shows a schematic flow diagram of a method for providing a linearity information according to the teachings disclosed herein.

FIG. 16 shows a schematic flow diagram for a method of providing a linearity information associated with an amplifier. At an action 802, information describing a gain of the amplifier for at least one bias condition is obtained. Information about the at least one bias condition is obtained during an action 804. The order of the actions 802 and 804 may be inversed, or the actions 802 and 804 may be performed concurrently.

At an action 806, the information describing the gain of the amplifier and the information about the at least one bias condition are used in connection with a gain-bias characteristic to determine a relation of a current operating point (current in the sense of "at this time", not in the sense of "electrical current") with respect to the gain-bias characteristic. The current operating point is defined by the information describing the gain and the information about the at least one bias condition. The determination of the relation between the current operating point and the gain-bias characteristic may comprise an analysis of whether the current operating point is right on, above, or beneath the gain-bias characteristic. As an alternative, a distance between the current operating point and the gain-bias characteristic according to a suitable scalar measure may be determined.

On the basis of the determined relation, the sought linearity information is derived from said relation at 808. To this end, the relation may be interpreted or mapped to a measure of linearity. The measure of linearity may be a continuous, scalar measure or it may be discrete measure with values such as "good linearity", "average linearity", "low linearity", and "non-linear".

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus. Some or all of the method steps may be executed by (or using) a hardware apparatus, like for example, a microprocessor, a programmable computer or an electronic circuit. In some embodiments, some one or more of the most important method steps may be executed by such an apparatus.

Depending on certain implementation requirements, embodiments of the invention can be implemented in hardware or in software. The implementation can be performed using a digital storage medium, for example a floppy disk, a DVD, a Blue-Ray, a CD, a ROM, a PROM, an EPROM, an EEPROM or a FLASH memory, having electronically readable control signals stored thereon, which cooperate (or are capable of cooperating) with a programmable computer system such that the respective method is performed. Therefore, the digital storage medium may be computer readable.

Some embodiments according to the invention comprise a data carrier having electronically readable control signals, which are capable of cooperating with a programmable computer system, such that one of the methods described herein is performed.

Generally, embodiments of the present invention can be implemented as a computer program product with a program code, the program code being operative for performing one of the methods when the computer program product runs on a computer. The program code may for example be stored on a machine readable carrier.

Other embodiments comprise the computer program for performing one of the methods described herein, stored on a machine readable carrier.

In other words, an embodiment of the inventive method is, therefore, a computer program having a program code for performing one of the methods described herein, when the computer program runs on a computer.

A further embodiment of the inventive methods is, therefore, a data carrier (or a digital storage medium, or a computer-readable medium) comprising, recorded thereon, the computer program for performing one of the methods described herein. The data carrier, the digital storage medium or the recorded medium are typically tangible and/or non-transitory.

A further embodiment of the inventive method is, therefore, a data stream or a sequence of signals representing the computer program for performing one of the methods described herein. The data stream or the sequence of signals may for example be configured to be transferred via a data communication connection, for example via the Internet.

A further embodiment comprises a processing means, for example a computer, or a programmable logic device, configured to or adapted to perform one of the methods described herein.

A further embodiment comprises a computer having installed thereon the computer program for performing one of the methods described herein.

A further embodiment according to the invention comprises an apparatus or a system configured to transfer (for example, electronically or optically) a computer program for performing one of the methods described herein to a receiver. The receiver may, for example, be a computer, a mobile device, a memory device or the like. The apparatus or system may, for example, comprise a file server for transferring the computer program to the receiver.

In some embodiments, a programmable logic device (for example a field programmable gate array) may be used to perform some or all of the functionalities of the methods described herein. In some embodiments, a field programmable gate array may cooperate with a microprocessor in order to perform one of the methods described herein. Generally, the methods are preferably performed by any hardware apparatus.

The above described embodiments are merely illustrative for the principles of the present invention. It is understood that modifications and variations of the arrangements and the details described herein will be apparent to others skilled in the art. It is the intent, therefore, to be limited only by the scope of the impending patent claims and not by the specific details presented by way of description and explanation of the embodiments herein.

What is claimed is:

1. An apparatus for providing a linearity information associated with an amplifier, the apparatus comprising:
   an operating state determinator configured to obtain information describing a gain of the amplifier for a bias condition of the amplifier; and
   an evaluator configured to obtain the linearity information based on both the information describing the gain of the amplifier and information about the bias condition of the amplifier using a gain-bias characteristic of the amplifier,
   wherein the evaluator is further configured to determine a relation of a current operating point described by the information describing the gain of the amplifier and the information about the bias condition with respect to an expected gain-bias characteristic, and derive the linearity information from the determined relation.

2. The apparatus according to claim 1, wherein the gain-bias characteristic comprises a small-signal gain-bias characteristic of the amplifier.

3. The apparatus according to claim 1, wherein the information describing the gain of the amplifier comprises at least one of an information about a gain factor of the amplifier, an information about an input power of the amplifier, and an information about an output power of the amplifier.

4. The apparatus according to claim 1, wherein the evaluator is further configured to compare the information describing the gain of the amplifier with at least one gain threshold in order to grade the linearity information according to at least two categories.

5. The apparatus according to claim 4, wherein the evaluator is further configured to generate the at least one gain threshold as an offset on a small signal-gain, wherein a condition is in an accepted category of the at least two categories if the information describing the gain is above the at least one gain threshold, and wherein a condition indicates that a compression level of the amplifier is too high if the information describing the gain is under the at least one gain threshold.

6. The apparatus according to claim 4, wherein the at least one gain threshold is determined based on a small-signal gain-bias characteristic of the amplifier and is dependent on the information about the bias condition.

7. The apparatus according to claim 6, wherein the information describing the gain comprises an information describing an input power to the amplifier and wherein the linearity information corresponds to an estimate of the linearity of the amplifier.

8. The apparatus according to claim 4, wherein the at least two categories of the linearity information comprise a comparatively high linearity category and a comparatively low linearity category.

9. The apparatus according to claim 1, wherein the evaluator is further configured to determine an actual variation of the information describing the gain of the amplifier between a first bias condition and a second bias condition, compare the actual variation with a reference variation of the information describing the gain of the amplifier between the first bias condition and the second bias condition, and obtain the linearity information as a function of a deviation of the actual variation from the reference variation,
   wherein the reference variation describes an allowable variation of the information describing the gain for which a corresponding linearity information is within a predetermined acceptable limit.

10. The apparatus according to claim 1, further comprising a reference value determinator configured to determine a first value of the information describing the gain corresponding to an operating state of the amplifier in which the amplifier operates in a substantially linear mode, and further configured to adjust the gain-bias characteristic so that the gain-bias characteristic substantially comprises a first operating point described by the first value and a corresponding bias condition.

11. The apparatus according to claim 10, further comprising a bias condition comparator configured to compare the bias condition with a bias condition threshold that ensures a predetermined linearity, wherein a comparison result of the bias condition comparator indicates to the reference value determinator whether the amplifier operates in the substantially linear mode for triggering the determination of the first value of the information describing the gain.

12. The apparatus according to claim 1, further comprising a bias condition controller configured to change the bias condition of the amplifier to cause the amplifier to attain at least two different values of the information describing the gain of the amplifier,
wherein the evaluator is configured to exploit the at least two different values and at least two corresponding bias conditions.

13. The apparatus according to claim 12, wherein the bias condition controller is further configured to set the bias condition to a comparatively high bias value and to a lower bias value,
wherein the evaluator is further configured to determine a deviation between a) a value describing the gain of the amplifier at the lower bias value and b) a previously determined value describing the gain of the amplifier at the lower bias value for a small-signal case, and also further configured to determine the linearity information as a function of the determined deviation.

14. The apparatus according to claim 12, wherein the bias condition controller is configured to change the bias condition in an iterative manner until at least one of the information describing the gain and the bias condition reaches or exceeds a threshold defined by the gain-bias characteristic.

15. The apparatus according to claim 1, further comprising a gain-bias characteristic provider configured to provide a small-signal gain-bias characteristic of the amplifier, wherein the gain-bias characteristic provider is configured to provide the amplifier with a suitable small-signal input and observe a corresponding output for at least one bias level.

16. The apparatus according to claim 1, further comprising:
a mismatch determinator configured to determine an amount of mismatch between an output of the amplifier and a load that is fed by an output signal of the amplifier;
wherein the evaluator comprises a threshold adjuster configured to use the determined amount of mismatch for adjusting a threshold gain-bias characteristic.

17. The apparatus according to claim 1, further comprising at least one of an input power detector for detecting an input power of the amplifier and an output power detector for detecting an output power of the amplifier,
wherein the operating state determinator is further configured to derive the information describing the gain of the amplifier from at least one of an information about the input power and an information about the output power.

18. An apparatus for providing a linearity information associated with an amplifier, the apparatus comprising:
an operating state determinator configured to obtain information describing a gain of the amplifier for a bias condition of the amplifier, wherein the information describing the gain comprises a temporal average over a selected time span;
a function value mapper configured to receive the information describing the gain of the amplifier and a corresponding bias condition, the function value mapper being configured to map the information describing the gain and the corresponding bias condition to a corresponding value of the linearity information using a predetermined gain-bias characteristic.

19. An apparatus for providing a linearity information associated with an amplifier, the apparatus comprising:
a means for obtaining information describing a gain of the amplifier for a bias condition of the amplifier, wherein the information describing the gain comprises a temporal average over a selected time span; and
a means for obtaining the linearity information based on both the information describing the gain of the amplifier and information about the bias condition of the amplifier using a gain-bias characteristic of the amplifier.

20. A method for providing a linearity information associated with an amplifier, the method comprising:
obtaining information describing a gain of the amplifier for a bias condition of the amplifier, wherein the information describing the gain comprises a temporal average over a selected time span;
obtaining information about the bias condition; and
obtaining the linearity information based on both the information describing the gain of the amplifier and the information about the bias condition using a gain-bias characteristic of the amplifier.

21. The method according to claim 20, wherein using the gain-bias characteristic comprises determining a distance, in a gain-bias plane, between the current operating points and at least one previously determined reference operating point, in order to derive the linearity information based on the distance.

22. The method according to claim 21, wherein the reference operating point corresponds to a small-signal mode of operation of the amplifier.

23. The method according to claim 22, further comprising:
setting the bias condition to a setting in which the amplifier exhibits a substantially linear behavior;
changing the bias condition in order to reduce a bias level of the amplifier;
observing a variation of the information describing the gain of the amplifier in response to the changed bias condition;
comparing the variation with an expected variation of the information describing the gain; and
deriving the linearity information from a difference between the variation of the information describing the gain and a variation of the extracted information describing the gain.

24. The apparatus according to claim 1, wherein the information describing the gain comprises a temporal average over a selected time span.

25. An apparatus for providing a linearity information associated with an amplifier, the apparatus comprising:
an operating state determinator having an input and an output associated therewith, wherein the operating state determinator is configured to receive at the input an information of the amplifier and wherein the operating state determinator is configured to provide at the output a gain information for a bias condition of the amplifier, wherein the gain information describes a gain of the amplifier or a quantity related to the gain of the amplifier; and
an evaluator having inputs and an output associated herewith, wherein the evaluator is configured to receive at the first input a gain information from the operating state determinator, receive at a second input an information of the amplifier, and receive at a third input a gain-bias characteristic, and wherein the evaluator is configured to provide at the output the linearity information based on both the information describing the gain of the amplifier and information about the bias condition of the amplifier using a gain-bias characteristic of the amplifier.

* * * * *